(12) United States Patent
Shimomura et al.

(10) Patent No.: US 8,741,740 B2
(45) Date of Patent: Jun. 3, 2014

(54) METHOD FOR MANUFACTURING SOI SUBSTRATE

(75) Inventors: Akihisa Shimomura, Kanagawa (JP); Hajime Tokunaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 220 days.

(21) Appl. No.: 12/568,772

(22) Filed: Sep. 29, 2009

(65) Prior Publication Data

US 2010/0087045 A1    Apr. 8, 2010

(30) Foreign Application Priority Data

Oct. 2, 2008    (JP) ................................. 2008-257032

(51) Int. Cl.
*H01L 21/30* (2006.01)

(52) U.S. Cl.
USPC .................... 438/458; 438/473; 257/E21.482; 257/E21.568

(58) Field of Classification Search
CPC ............ H01L 21/265; H01L 21/76254; H01L 21/76224; H01L 27/1214
USPC .......... 438/473, 475, 799, 458; 257/E21.482, 257/E21.568, E21.567
See application file for complete search history.

(56) References Cited

U.S. PATENT DOCUMENTS

| | | | |
|---|---|---|---|
| 5,374,564 A | 12/1994 | Bruel | |
| 6,013,563 A | 1/2000 | Henley et al. | |
| 6,127,702 A | 10/2000 | Yamazaki et al. | |
| 6,242,320 B1 | 6/2001 | So | |
| 6,271,101 B1 | 8/2001 | Fukunaga | |
| 6,312,797 B1 | 11/2001 | Yokokawa et al. | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,468,923 B1 | 10/2002 | Yonehara et al. | |
| 6,534,380 B1 * | 3/2003 | Yamauchi et al. | 438/455 |

(Continued)

FOREIGN PATENT DOCUMENTS

| | | |
|---|---|---|
| EP | 1376700 A | 1/2004 |
| EP | 1548834 A | 6/2005 |

(Continued)

OTHER PUBLICATIONS

Lu.F et al., "Ion-Cutting of Si Onto Glass by Pulsed and Direct-Current Plasma Immersion Ion Implantation,", J. Vac. Sci. Technol. B (Journal of Vacuum Science & Technology B), 2003, vol. 21, No. 5, pp. 2109-2113.

*Primary Examiner* — Caridad Everhart
(74) *Attorney, Agent, or Firm* — Eric J. Robinson; Robinson Intellectual Property Law Office, P.C.

(57) ABSTRACT

An SOI substrate is manufactured by forming an embrittled layer in a bond substrate by increasing the dose of hydrogen ions in the formation of the embrittled layer to a value more than the dose of hydrogen ions of the lower limit for separation of the bond substrate, separating the bond substrate attached to the base substrate, forming an SOI substrate in which a single crystal semiconductor film is formed over the base substrate, and irradiating a surface of the single crystal semiconductor film with laser light.

39 Claims, 18 Drawing Sheets

(56) References Cited

U.S. PATENT DOCUMENTS

| | | |
|---|---|---|
| 6,602,761 B2 | 8/2003 | Fukunaga |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,908,797 B2 | 6/2005 | Takano |
| 7,094,667 B1 * | 8/2006 | Bower .................. 438/458 |
| 7,119,365 B2 | 10/2006 | Takafuji et al. |
| RE39,484 E | 2/2007 | Bruel |
| 7,176,525 B2 | 2/2007 | Fukunaga |
| 7,176,528 B2 | 2/2007 | Couillard et al. |
| 7,192,844 B2 | 3/2007 | Couillard et al. |
| 7,199,024 B2 | 4/2007 | Yamazaki |
| 7,247,545 B2 | 7/2007 | Maa et al. |
| 7,256,776 B2 | 8/2007 | Yamazaki et al. |
| 7,320,929 B2 | 1/2008 | Aga et al. |
| 7,399,681 B2 | 7/2008 | Couillard et al. |
| 7,476,576 B2 | 1/2009 | Yamazaki et al. |
| 7,476,940 B2 | 1/2009 | Couillard et al. |
| 7,508,034 B2 | 3/2009 | Takafuji et al. |
| 7,535,053 B2 | 5/2009 | Yamazaki |
| 7,560,313 B2 | 7/2009 | Aga et al. |
| 7,605,053 B2 | 10/2009 | Couillard et al. |
| 7,619,250 B2 | 11/2009 | Takafuji et al. |
| 7,632,739 B2 | 12/2009 | Hebras |
| 7,709,309 B2 | 5/2010 | Moriwaka |
| 7,709,337 B2 | 5/2010 | Jinbo et al. |
| 7,759,217 B2 * | 7/2010 | Henley et al. ............ 438/455 |
| 7,776,717 B2 * | 8/2010 | Henley et al. ............ 438/455 |
| 7,790,570 B2 | 9/2010 | Yamazaki |
| 7,800,148 B2 * | 9/2010 | Lee et al. ................. 257/292 |
| 7,816,736 B2 | 10/2010 | Yamazaki |
| 7,820,524 B2 | 10/2010 | Miyairi et al. |
| 7,834,398 B2 | 11/2010 | Yamazaki |
| 7,838,935 B2 | 11/2010 | Couillard et al. |
| 7,867,873 B2 | 1/2011 | Murakami et al. |
| 7,884,367 B2 | 2/2011 | Takafuji et al. |
| 7,897,476 B2 | 3/2011 | Yamazaki et al. |
| 7,902,034 B2 | 3/2011 | Yamazaki et al. |
| 7,978,190 B2 | 7/2011 | Yamazaki et al. |
| 2005/0260800 A1 | 11/2005 | Takano |
| 2006/0038228 A1 | 2/2006 | Aitken et al. |
| 2006/0040469 A1 * | 2/2006 | Aga et al. .................. 438/458 |
| 2006/0110899 A1 | 5/2006 | Bourdelle et al. |
| 2007/0020947 A1 | 1/2007 | Daval et al. |
| 2007/0037363 A1 * | 2/2007 | Aspar et al. .............. 438/459 |
| 2007/0054459 A1 | 3/2007 | Aga et al. |
| 2007/0173000 A1 | 7/2007 | Yamazaki |
| 2007/0281172 A1 * | 12/2007 | Couillard et al. ......... 428/446 |
| 2008/0061301 A1 | 3/2008 | Yamazaki |
| 2008/0067529 A1 | 3/2008 | Yamazaki |
| 2008/0200010 A1 * | 8/2008 | Endo et al. ............... 438/458 |
| 2008/0213953 A1 | 9/2008 | Yamazaki |
| 2008/0246109 A1 | 10/2008 | Ohnuma et al. |
| 2008/0286939 A1 * | 11/2008 | Ohnuma ................... 438/458 |
| 2008/0286941 A1 | 11/2008 | Yamazaki |
| 2008/0286942 A1 | 11/2008 | Yamazaki |
| 2009/0023271 A1 | 1/2009 | Couillard et al. |
| 2009/0095956 A1 | 4/2009 | Takafuji et al. |
| 2009/0149001 A1 * | 6/2009 | Cites et al. ............... 438/458 |
| 2011/0039072 A1 * | 2/2011 | Grzybowski et al. ...... 428/156 |

FOREIGN PATENT DOCUMENTS

| | | |
|---|---|---|
| EP | 1635389 A | 3/2006 |
| JP | 2000-077287 A | 3/2000 |
| JP | 2000-294754 A | 10/2000 |
| JP | 2002-305292 A | 10/2002 |
| JP | 2004-063730 A | 2/2004 |
| JP | 2004-087606 A | 3/2004 |
| JP | 2004-111521 A | 4/2004 |
| JP | 2004-214400 A | 7/2004 |
| JP | 2005-203596 A | 7/2005 |
| JP | 2005-252244 A | 9/2005 |

* cited by examiner

METHOD FOR MANUFACTURING SOI SUBSTRATE

BACKGROUND OF THE INVENTION

1. Field of the Invention

The present invention relates to a method for manufacturing a substrate provided with a semiconductor layer with an insulating film interposed therebetween, particularly, a silicon-on-insulator (SOI) substrate.

2. Description of the Related Art

In recent years, integrated circuits which use a silicon-on-insulator (SOI) substrate in which a thin single crystal semiconductor layer is provided over an insulating surface, instead of a bulk silicon wafer, have developed. By utilizing characteristics of a thin single crystal silicon film formed over an insulating film, transistors formed in the integrated circuit can be separated from each other completely. Further, since fully-depleted transistors can be formed, a semiconductor integrated circuit with high added value such as high integration, high speed driving, and low power consumption can be realized.

One of known methods for manufacturing an SOI substrate is a Smart Cut (registered trademark) method. By using a Smart Cut method, an SOI substrate having a single crystal silicon film over an insulating substrate such as a glass substrate can be manufactured in addition to an SOI substrate having a single crystal silicon film over a silicon substrate (for example, see Patent Document 1). The method for manufacturing an SOI substrate having a single crystal silicon thin film over a glass substrate by a Smart Cut method is briefly described below. First, a silicon dioxide film is formed over a surface of a piece of single crystal silicon. Next, hydrogen ions are implanted into the piece of single crystal silicon to form a hydrogen ion implanted plane at a predetermined depth from a surface of the piece of single crystal silicon. Then, the piece of single crystal silicon into which the hydrogen ions are implanted is attached to a glass substrate with the silicon dioxide film interposed therebetween. After that, the hydrogen ion implanted plane becomes a cleavage plane by performing heat treatment, and the piece of single crystal silicon into which the hydrogen ions are implanted is separated into a thin film state, so that a single crystal silicon thin film can be formed over the attached glass substrate. Such a Smart Cut method may also be referred to as a hydrogen ion implantation separation method.

CITATION LIST

[Patent Document 1] Japanese Published Patent Application No. 2004-87606

SUMMARY OF THE INVENTION

The surface of the single crystal silicon layer over an SOI substrate manufactured by a Smart Cut method has crystal defects and loses its planarity due to ion introduction for forming an embrittled layer (the hydrogen ion implanted plane) and separation of a single crystal silicon substrate (a bond substrate) by heat treatment.

If planarity of the single crystal silicon layer decreases and unevenness is caused on the surface, dielectric strength of a gate insulating film formed in manufacturing TFTs with the use of the SOI substrate is reduced. Moreover, crystal defects in the single crystal silicon layer cause an adverse effect on electrical characteristics of a semiconductor element.

When a substrate having high heat resistance such as a silicon substrate is used as a base substrate, heat treatment can be performed at a high temperature of 1000° C. or higher for recovery of crystallinity and planarization of the single crystal silicon layer. On the other hand, when a substrate having low heat resistance such as a glass substrate is used as a base substrate as described in Patent Document 1, recovery of crystallinity and planarization of the single crystal silicon layer cannot be conducted by such a method.

Further, as an example of a method for recovery of crystallinity and planarization of the single crystal silicon layer except heat treatment, laser light irradiation of the single crystal silicon layer can be given. By laser light irradiation of the single crystal silicon layer, recovery of crystallinity and planarization of the single crystal silicon layer can be conducted by melting the single crystal silicon layer without direct heating of the glass substrate. On the other hand, by laser light irradiation of the single crystal silicon layer, there is a problem in that a number of deficiency regions having a diameter of about 1 μm to 10 μm are caused in the single crystal silicon layer.

In view of the above-described problems, it is an object of one embodiment of the present invention to provide a method for manufacturing an SOI substrate which can be practically used even when a substrate having low heat resistance such as a glass substrate is used as a base substrate. In addition, it is another object of one embodiment of the present invention to manufacture a highly reliable semiconductor device using the SOI substrate.

The SOI substrate according to one embodiment of the present invention is manufactured by forming an embrittled layer in a bond substrate by increasing the dose of hydrogen ions in the formation of the embrittled layer to a value more than the dose of hydrogen ions of the lower limit for separation of the bond substrate, separating the bond substrate attached to a base substrate, forming an SOI substrate in which a single crystal semiconductor film is formed over the base substrate, and irradiating a surface of the single crystal semiconductor film with laser light.

A method for manufacturing the SOI substrate according to one embodiment of the present invention includes the steps of: forming an insulating film over a bond substrate; forming an embrittled layer in the bond substrate by irradiating the bond substrate with hydrogen ions through the insulating film; attaching the bond substrate to a base substrate with the insulating film interposed therebetween; separating the bond substrate along the embrittled layer by heat treatment; forming a semiconductor film over the base substrate with the insulating film interposed therebetween; and irradiating the semiconductor film with laser light, in which a dose of hydrogen ions in the irradiation with hydrogen ions is set to a dose 2.2 times or more as high as a minimal dose of hydrogen ions for separation of the bond substrate by the heat treatment. Further, it is preferable that the dose of hydrogen ions in the irradiation with hydrogen ions be set to a dose 2.2 times to 3.0 times as high as a minimal dose of hydrogen ions for separation of the bond substrate by the heat treatment.

Another method for manufacturing the SOI substrate according to one embodiment of the present invention includes the steps of: forming an insulating film over a bond substrate; forming an embrittled layer in the bond substrate by irradiating the bond substrate with hydrogen ions through the insulating film; attaching the bond substrate to a base substrate with the insulating film interposed therebetween; separating the bond substrate along the embrittled layer by heat treatment; forming a semiconductor film over the base substrate with the insulating film interposed therebetween;

and irradiating the semiconductor film with laser light, in which a dose of hydrogen ions in the irradiation with hydrogen ions is set to $2.2\times10^{16}$ ions/cm$^2$ or more. Further, it is preferable that the dose of hydrogen ions in the irradiation with hydrogen ions be set to greater than or equal to $2.2\times10^{16}$ ions/cm$^2$ and less than or equal to $3.0\times10^{16}$ ions/cm$^2$.

In addition, it is preferable that a natural oxide film formed on a surface of the semiconductor film be removed before the irradiation with laser light. It is more preferable that the natural oxide film be removed by dry etching. Moreover, it is preferable that the semiconductor film be partially melted by the irradiation with laser light.

Further, it is preferable that the insulating film be formed using a single film or a plurality of stacked films selected from a silicon oxide film, a silicon nitride film, a silicon oxynitride film, and a silicon nitride oxide film. Furthermore, it is preferable that the silicon oxide film be formed by a chemical vapor deposition method using an organosilane gas or be formed by thermal oxidation of the bond substrate. In addition, it is preferable that a second insulating film be formed over and in contact with the base substrate, and it is more preferable that the second insulating film be a silicon nitride film or a silicon nitride oxide film. In addition, it is preferable that the bond substrate be a single crystal silicon substrate. And, it is preferable that the base substrate be an aluminosilicate glass substrate, a barium borosilicate glass substrate, or an aluminoborosilicate glass substrate.

Further, it is preferable that the irradiation with hydrogen ions be performed using an ion doping apparatus.

The term "single crystal" in this specification refers to a crystal whose crystal faces or crystal axes are aligned and whose atoms or molecules are spatially ordered. Note that although a single crystal is structured by orderly aligned atoms, a single crystal may include a lattice defect in which the alignment is partially disordered or a single crystal may include intended or unintended lattice distortion.

The term "embrittled layer" in this specification refers to a weakened layer of a semiconductor substrate, which is formed by irradiating the semiconductor substrate with an ion beam so that crystal defects are formed by ions. This embrittled layer is separated by generation of a crack by heat treatment or the like, so that a semiconductor film can be separated from the semiconductor substrate.

In accordance with one embodiment of the present invention, by irradiating a single crystal semiconductor film over an SOI substrate with laser light, crystal defects of the single crystal semiconductor film over the glass substrate can be repaired and planarity of the single crystal semiconductor film can be improved. Moreover, the dose of hydrogen ions in the formation of an embrittled layer is set to a dose 2.2 times or more as high as the lower limit of the dose of hydrogen ions for separation of the bond substrate, so that a deficiency region caused in the single crystal semiconductor film by irradiation with laser light can be reduced. Accordingly, an SOI substrate having a single crystal semiconductor film in which crystal defects are repaired, planarity is improved, and deficiency regions are reduced over a glass substrate can be manufactured.

In addition, a high performance and highly reliable semiconductor device can be manufactured by using the above-described SOI substrate.

DETAILED DESCRIPTION OF THE INVENTION

Figure 1A:
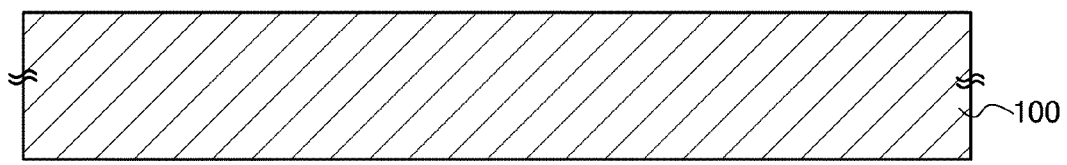
FIGS. 1A to 1C are diagrams illustrating an example of a method for manufacturing an SOI substrate according to one embodiment of the present invention.

Embodiments of the present invention will be described below with reference to the accompanying drawings. Note that it is easily understood by those skilled in the art that the present invention can be implemented in many different modes and modes and details can be modified in a variety of ways without departing from the purpose and scope of the present invention. Therefore, the present invention should not be construed as being limited to the description of the embodiments. Note that reference numerals indicating the same portions and portions having a similar function are used in common in the drawings in this specification, and repeated descriptions thereof may be omitted.

Embodiment 1

In a method for manufacturing an SOI substrate according to this embodiment, an SOI substrate is manufactured by attaching a semiconductor film separated from a semiconductor substrate which serves as a bond substrate to a base substrate. A method for manufacturing an SOI substrate according to this embodiment is described below with reference to FIGS. 1A to 1C, FIGS. 2A to 2C, and FIGS. 3A to 3C.

First, a bond substrate 100 illustrated in FIG. 1A is prepared. As the bond substrate 100, a commercially available semiconductor substrate, for example, a single crystal semiconductor substrate formed of silicon, germanium, or the like or a polycrystalline semiconductor substrate formed of silicon, germanium, or the like can be used. Alternatively, a single crystal semiconductor substrate formed of a compound semiconductor such as gallium arsenide or indium phosphide or a polycrystalline semiconductor substrate formed of a compound semiconductor such as gallium arsenide or indium phosphide can be used as the bond substrate 100. Further, a polycrystalline semiconductor substrate can be manufactured by a czochralski (CZ) method or a floating zone (FZ) method.

Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, 16 inches (400 mm) in diameter, and 18 inches (450 mm) in diameter. The bond substrate 100 processed into a rectangular shape or a polygonal shape can also be used. Note that in this specification, the rectangular shape includes a square and an oblong. A case in which a single crystal silicon substrate is used as the bond substrate 100 is described below.

Figure 1B:
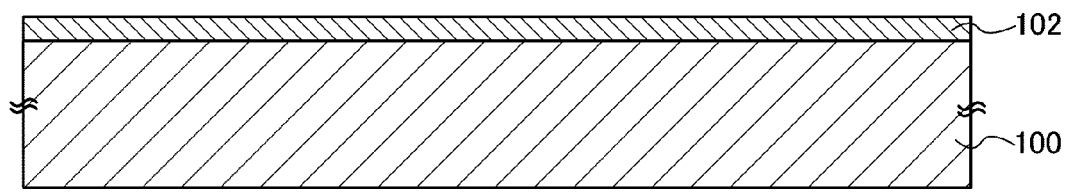

Next, as illustrated in FIG. 1B, an insulating film 102 is formed on a bond substrate 100. The insulating film 102 may be either a single insulating film or stacked layers of a plurality of insulating films. In this embodiment, for example, the insulating film 102 is formed using silicon oxide. As a film which is used for the insulating film 102, it is preferable that an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film be used. Alternatively, an insulating film formed using metal oxide such as aluminum oxide, tantalum oxide, or hafnium oxide; an insulating film formed using metal nitride such as aluminum nitride; an insulating film formed using metal oxynitride such as aluminum oxynitride; or an insulating film formed using metal nitride oxide such as aluminum nitride oxide, can be used as the insulating film 102. Further, it is preferable that a surface of the bond substrate 100 be cleaned in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like.

Note that in this specification, the term "oxynitride" refers to a substance which contains more oxygen atoms than nitrogen atoms; whereas the term "nitride oxide" refers to a substance which contains more nitrogen atoms than oxygen atoms. For example, the term "silicon oxynitride film" means a film which contains more oxygen atoms than nitrogen atoms and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the term "silicon nitride oxide film" means a film which contains more nitrogen atoms than oxygen atoms and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

In the case of using silicon oxide for the insulating film 102, the insulating film 102 can be formed using a mixed gas of silane and oxygen, a mixed gas of tetraethoxysilane (TEOS) and oxygen, or the like by a vapor deposition method such as a thermal CVD method, a plasma-enhanced CVD method, an atmospheric pressure CVD method, or a bias ECRCVD method. In this case, a surface of the insulating film 102 may be densified with oxygen plasma treatment.

Alternatively, the insulating film 102 may be formed using silicon oxide which is formed with the use of an organosilane gas by a chemical vapor deposition method. As the organosilane gas, a silicon containing compound such as tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), and the like can be used.

Further alternatively, the insulating film 102 can be formed using an oxide film formed by oxidizing the bond substrate 100. As thermal oxidation treatment for forming the above-described oxide film, dry oxidation may be used or a gas containing halogen may be further added to an oxidizing atmosphere. As a gas containing halogen, one or plural kinds of gases selected from HCl, HF, $NF_3$, HBr, $Cl_2$, ClF, $BCl_3$, $F_2$, $Br_2$, and the like can be used. Note that in FIG. 1B, the insulating film 102 is formed over one surface of the bond substrate 100; however, this embodiment is not limited thereto. When the insulating film 102 is formed using an oxide film obtained by oxidizing the bond substrate 100, the insulating film 102 may be formed so as to cover the bond substrate 100.

For example, heat treatment is performed at a temperature of greater than or equal to 700° C. and less than or equal to 1100° C. in an atmosphere containing HCl (hydrogen chloride) at 0.5 volume % to 10 volume % (preferably, 2% volume %) with respect to oxygen. For example, heat treatment may be performed at a temperature of about 950° C. Treatment time may be 0.1 to 6 hours, preferably, 2.5 to 3.5 hours. The thickness of the oxide film to be formed may be set in the range of 15 nm to 1100 nm, preferably, 50 nm to 150 nm.

By such thermal oxidation treatment in an atmosphere containing halogen, halogen can be contained in the oxide film. By containing a halogen element at a concentration of $1 \times 10^{17}$ atoms/cm$^3$ to $1 \times 10^{21}$ atoms/cm$^3$, the oxide film captures heavy metal that is an extrinsic impurity (for example, Fe, Cr, Ni, Mo, and the like), so that contamination of the semiconductor film to be formed later can be prevented. Moreover, by a halogen element contained in the oxidation treatment, defects on the surface of the bond substrate 100 are terminated, and the localized level density at an interface between the oxide film and the bond substrate 100 can be reduced.

Further, the inclusion of halogen such as chlorine in the insulating film 102 by HCl oxidation or the like makes it possible to getter impurities (for example, movable ions of Na or the like) which have an adverse effect on the bond substrate 100. Specifically, by heat treatment which is performed after the insulating film 102 is formed, impurities contained in the bond substrate 100 are separated out to the insulating film 102 and captured by reacting with halogen atoms (for example, chlorine atoms). Accordingly, the impurities captured in the insulating film 102 can be fixed and prevented from contaminating the bond substrate 100. Further, when the insulating film 102 is attached to a glass substrate, the insulating film 102 can also function as a film for fixing impurities, such as Na, contained in glass.

When a substrate including an impurity which may decrease the reliability of a semiconductor device, such as alkali metal or alkaline-earth metal, is used for the base substrate, the insulating film 102 is preferably provided with at least one film capable of preventing diffusion of the impurity from the base substrate into the semiconductor film of the SOI substrate. As such a film, a silicon nitride film, a silicon nitride oxide film, an aluminum nitride film, an aluminum nitride oxide film, and the like can be given. With the provision of such a film, the insulating film 102 can function as a barrier film.

When the insulating film 102 is formed using silicon nitride, the insulating film 102 can be formed using a mixed gas of silane and ammonium by a vapor deposition method such as plasma-enhanced CVD. Further, when the insulating film 102 is formed using silicon nitride oxide, the insulating film 102 can be formed using a mixed gas of silane and ammonium or a mixed gas of silane and oxynitride by a vapor deposition method such as plasma-enhanced CVD.

For example, when the insulating film 102 is formed as a barrier film with a single-layer structure, the insulating film 102 can be formed using a silicon nitride film, a silicon nitride oxide film, an aluminum nitride film, or an aluminum nitride oxide film having a thickness of 15 nm to 300 nm, inclusive.

Further, when the insulating film 102 is formed as a barrier film with a two-layer structure, the upper layer of the insulating film is formed to have a high barrier property. The upper layer of the insulating film can be formed using, for example, a silicon nitride film or a silicon nitride oxide film having a thickness of 15 nm to 300 nm, inclusive. These films have a high blocking effect for preventing impurity diffusion, but their internal stress is also high. Therefore, as the lower layer of the insulating film which is in contact with the bond substrate 100, a film with an effect of relieving the stress of the upper layer of the insulating film is preferable. As the insulating film with the effect of relieving the stress of the upper layer of the insulating film, a silicon oxide film, a silicon oxynitride film, a thermal oxide film formed by thermally oxidizing the bond substrate 100, and the like are given. The lower layer of the insulating film can be formed to a thickness of 5 nm to 200 nm, inclusive.

For example, the insulating film 102 may be formed in combination of a silicon oxide film and a silicon nitride film, a silicon oxynitride film and a silicon nitride film, a silicon oxide film and a silicon nitride oxide film, a silicon oxynitride film and a silicon nitride oxide film, and the like, so that the insulating film 102 can function as a blocking film.

Further, when the insulating film 102 is formed as a barrier film with a two-layer structure, the insulating film 102 may have a three-layer structure by forming another film over the two-layer film. In such a case, a top layer of the insulating film functions as a bonding surface. Thus, it is preferable that the top layer of the insulating film have a smooth surface with high hydrophilicity. Accordingly, the top layer of the insulating film is preferably formed by a chemical vapor reaction, and a silicon oxide film is preferable. In addition, the insulating film functioning as a bonding surface may be formed after the ion irradiation of the bond substrate 100, which is performed later. When the insulating film is formed after the ion irradiation, the smooth surface with high hydrophilicity is not roughened by the ion irradiation. Note that the heating temperature is preferably 350° C. or lower after the ion irradiation so that ions used for the irradiation can be prevented from being separated out from the bond substrate 100.

In the case of forming a silicon oxide film by a plasma-enhanced CVD method as the top layer of the insulating film, it is preferable to use an organosilane gas and an oxygen ($O_2$) gas for a source gas. By using an organosilane gas as a source gas, a silicon oxide film having a smooth surface can be formed at a process temperature of 350° C. or lower. Alternatively, the top layer of the insulating film can be formed using a low temperature oxide (LTO) which is formed at a heating temperature of 200° C. to 500° C., inclusive, by a thermal CVD method. The LTO can be formed using monosilane ($SiH_4$), disilane ($Si_2H_6$), or the like for a silicon source gas and dinitrogen monoxide ($N_2O$) or the like for an oxygen source gas. The thickness of the insulating film functioning as a bonding surface can be 5 nm to 500 nm, inclusive; preferably, 10 nm to 200 nm, inclusive. The average surface roughness $R_a$ is preferably 0.7 nm or less, more preferably, 0.4 nm or less.

For example, when the top layer of the insulating film is formed using a silicon oxide film with the use of TEOS and $O_2$ for a silicon source gas, the conditions may be set as follows: the flow rate of TEOS is 15 sccm, the flow rate of $O_2$ is 750 sccm, the film forming pressure is 100 Pa, the film forming temperature is 300° C., the RF output is 300 W, and the power source frequency is 13.56 MHz.

Note that an insulating film formed at a relatively low temperature, such as a silicon oxide film formed with organosilane or a silicon nitride oxide film formed at a low temperature, includes a large number of OH groups on its surface. Hydrogen bonding between the OH group and a water molecule forms a silanol group and bonds the base substrate to the insulating film at a low temperature. A siloxane bond, which is a covalent bond, is formed lastly between the base substrate and the insulating film. Therefore, it can be said that the insulating film such as the above-described silicon oxide film formed using organosilane or the LTO formed at a relatively low temperature is suitable for bonding at a low temperature, as compared with a thermal oxide film having no OH groups or having very few OH groups which is used in a Smart Cut method or the like.

Figure 1C:
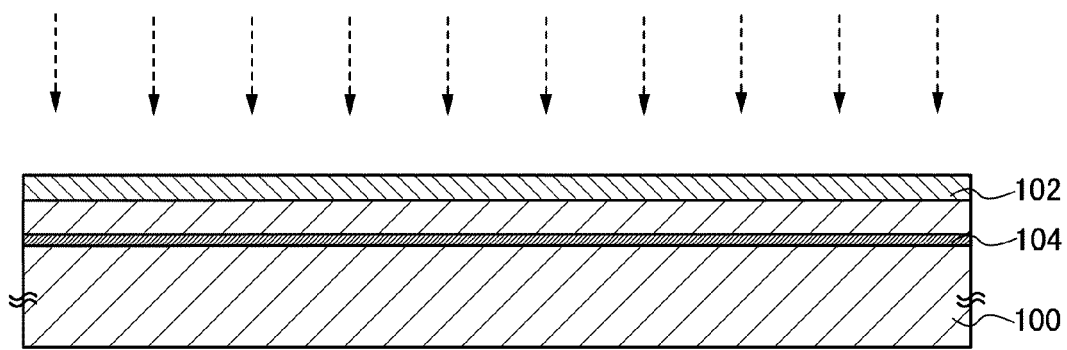

Next, as illustrated in FIG. 1C, the bond substrate 100 is irradiated with an ion beam including ions accelerated by an electric field as indicated by arrows through the insulating film 102. Thus, an embrittled layer 104 having microvoids is formed in a region at a predetermined depth from the surface of the bond substrate 100. The depth at which the embrittled layer 104 is formed can be adjusted by the acceleration energy of the ion beam and the angle at which the ion beam enters. The acceleration energy can be adjusted by an acceleration voltage, dose, or the like. The embrittled layer 104 is formed at the same depth or substantially the same depth as the average penetration depth of the ions. Therefore, the thickness of a semiconductor film 112 which is separated from the bond substrate 100 later is determined depending on the depth at which the ions are added. The depth at which the embrittled layer 104 is formed can be set in the range of, for example, 50 nm to 500 nm, inclusive, preferably, 50 nm to 200 nm inclusive, for example, about 100 nm, from the surface of the bond substrate 100.

When the bond substrate 100 is irradiated with an ion beam, an ion doping apparatus in which mass separation is not performed is used. By using an ion doping apparatus, the bond substrate 100 can be homogeneously irradiated with ions. A typical ion doping apparatus is a non-mass-separation apparatus with which an object placed in a chamber is irradiated with all kinds of ions generated by excitation of a process gas into plasma. An object is irradiated with all kinds of ions in plasma without mass separation by the non-mass-separation apparatus. The non-mass-separation ion doping apparatus can perform ion irradiation efficiently in a short time as compared with the mass-separation ion implantation apparatus. Thus, the non-mass-separation ion doping apparatus is preferably used.

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ions, an electrode for exciting a source gas to generate plasma, and the like. As the electrode for generating plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to the components described above and an as-needed mechanism may be provided.

As a source gas, a hydrogen ($H_2$) gas is used. $H^+$, $H_2^+$, and $H_3^+$ can be produced by exciting a hydrogen gas. The proportion of ion species produced from the source gas can be changed by adjusting a plasma excitation method, pressure in an atmosphere for generating plasma, the amount of the supply of a source gas, and the like. In the case where the ion irradiation is performed by an ion doping apparatus, it is preferable that $H_3^+$ be contained at 70% or more with respect to the total amount of $H^+$, $H_2^+$, and $H_3^+$ in the ion beam, and it is more preferable that the proportion of $H_3^+$ be 80% or more. When $H_3$ occupies 70% or more, the proportion of $H_2^+$ ions in the ion beam decreases relatively, which results in lower variations in the average penetration depth of hydrogen ions included in the ion beam. Consequently, the ion addition efficiency is improved and the takt time can be shortened.

Further, $H_3^+$ has larger mass than $H^+$ and $H_2^+$. Thus, when the ion beam containing a larger proportion of $H_3^+$ is compared with the ion beam containing a larger proportion of $H^+$ and $H_2^+$ the former can add hydrogen to a shallower region of the bond substrate 100 than the latter even though the acceleration voltage at the time of doping is the same. Moreover, the former has a steep concentration profile of hydrogen added to the bond substrate 100 in a thickness direction, so that the embrittled layer 104 itself can be formed to be thinner.

Here, by increasing the dose of hydrogen ions to a value more than the dose of hydrogen ions of the lower limit for separation of the bond substrate 100, the deficiency region of the semiconductor film, which is caused when the semiconductor film of the SOI substrate is irradiated with laser light in a later step, can be reduced. When the dose of hydrogen ions is increased, the number of microvoids included in the embrittled layer 104 is increased and the number of microvoids which is formed at a position of the average penetration depth is remarkably increased, as compared with the number of microvoids which deviate from a position of the average penetration depth. Note that as hydrogen ions, one or plural kinds of ions selected from $H^+$, $H_2^+$ and $H_3^+$ are included.

Figure 8A:
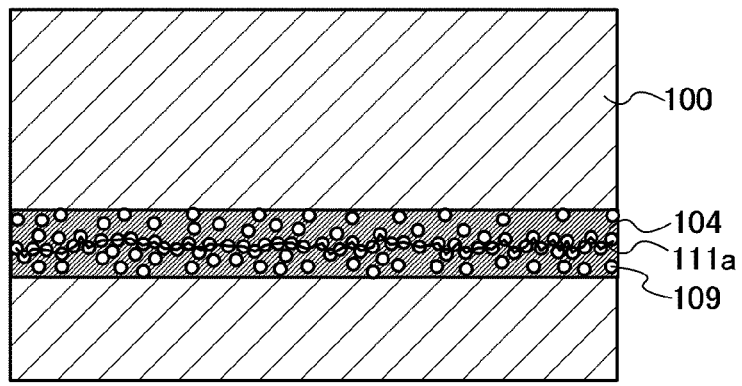
FIGS. 8A to 8C are cross-sectional views of a bond substrate and an embrittled layer according to one embodiment of the present invention.
Figure 8B:
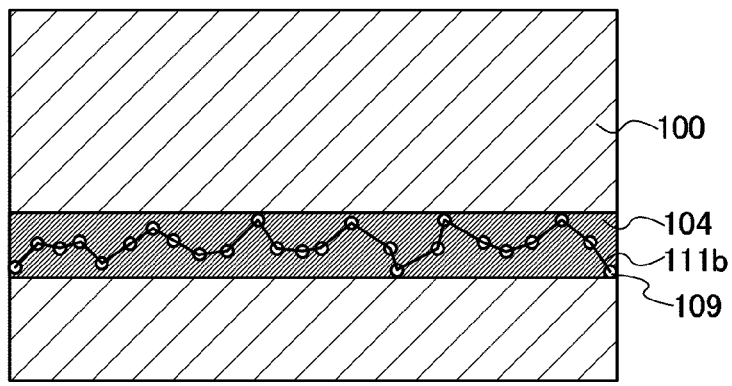
Figure 8C:
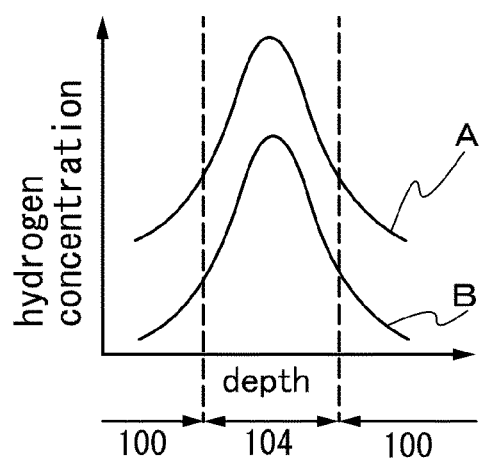

Here, schematic views of a separation surface 111a and a separation surface 111b, which are formed by combining microvoids 109 with each other by performing heat treatment on the bond substrate 100, are illustrated in FIGS. 8A and 8B. FIG. 8A illustrates a case where the dose of hydrogen ions is high, and FIG. 8B illustrates a case where the dose of hydrogen ions is low. FIG. 8C shows a schematic diagram of a graph comparing hydrogen concentrations in the vicinity of the embrittled layer 104 illustrated in FIGS. 8A and 8B. In the graph in FIG. 8C, the vertical axis indicates the hydrogen concentration, the horizontal axis indicates the depth from the interface between the insulating film 102 and the bond substrate 100, a curve A indicates the hydrogen concentration in the bond substrate 100 illustrated in FIG. 8A, and a curve B indicates the hydrogen concentration in the bond substrate 100 illustrated in FIG. 8B.

In the case of the high dose of hydrogen ions, the curve A has a peak of the hydrogen concentration at a position of the average penetration depth as shown in FIG. 8C. Thus, as illustrated in FIG. 8A, the microvoids 109 formed at a position of the average penetration depth are easily combined with each other; therefore, locally large unevenness caused on the separation surface 111a is suppressed. Accordingly, locally large unevenness of the semiconductor film over the SOI substrate is also suppressed.

In contrast, in the case of the low dose of hydrogen ions, as shown in FIG. 8C, the curve B also has a peak of the hydrogen concentration at a position of the average penetration depth; however, the peak is lower compared with the case where the dose of hydrogen ions is high. Therefore, as illustrated in FIG. 8B, the number of the microvoids 109 formed at a position of the average penetration depth is reduced and the microvoids formed at a position of the average penetration depth are not easily combined with each other even if heat treatment is performed. Because the probability of occurrence of combination of the microvoids 109 which deviate from a position of the average penetration depth is relatively increased, local unevenness is easily caused on the separation surface 111b. Accordingly, local unevenness of the semiconductor film over the SOI substrate is also easily caused.

When locally large unevenness, especially, a region where the thickness is locally small, is caused on the semiconductor film over the SOI substrate, ablation is caused at a region where the thickness of the semiconductor film is small in laser irradiation of the semiconductor film in a later step. As a result, the deficiency region is formed in the semiconductor film. However, by performing ion irradiation with the increased dose of hydrogen ions, the region where the thickness of the semiconductor film over the SOI substrate is locally small is reduced, so that the formation of the deficiency region due to ablation of the semiconductor film can be suppressed even if the semiconductor film is irradiated with laser light.

In order to reduce the deficiency region of the semiconductor film over the SOI substrate by irradiation with laser light, the dose of hydrogen ions is preferably set to a dose 2.2 times or more as high as the lower limit of the dose of hydrogen ions for separation of the bond substrate 100. In particular, the dose of hydrogen ions is preferably set to $2.2 \times 10^{16}$ ions/cm$^2$ or more. Note that when the dose of hydrogen ions is increased, hydrogen molecules are formed in the embrittled layer 104 and the bond substrate 100 is easily separated. Alternatively, because crystallinity of the semiconductor film formed over a base substrate 108 is lowered in a later step, the dose of hydrogen ions is preferably set to a dose 3.0 times or less as high as the lower limit of the dose of hydrogen ions for separation of the bond substrate 100. In particular, the dose of hydrogen ions is preferably set to $3.0 \times 10^{16}$ ions/cm$^2$ or less. Note that in this specification, the term "lower limit for separation of a bond substrate" refers to the dose of hydrogen ions in forming an embrittled layer over a bond substrate and the minimal dose of hydrogen ions in separating a bond substrate by heat treatment.

Therefore, the preferable conditions for performing ion irradiation by an ion doping apparatus using a hydrogen gas are as follows: the acceleration voltage is greater than or equal to 10 kV and less than or equal to 200 kV and the dose is greater than or equal to $2.2\times10^{16}$ ions/cm$^2$ and less than or equal to $3.0\times10^{16}$ ions/cm$^2$. The embrittled layer 104 can be formed at a depth of greater than or equal to 50 nm and less than or equal to 500 nm, preferably, greater than or equal to 50 nm and less than or equal to 200 nm, for example, about 100 nm from the surface of the bond substrate 100 although it depends on ion species included in an ion beam and its proportion and the thickness of the insulating film 102.

Further, in this embodiment, the ion irradiation is performed after the insulating film 102 is formed; however, the present invention is not limited thereto, and the ion irradiation may be performed before the insulating film 102 is formed. Note that when a thermal oxide film of the bond substrate 100 is used as the insulating film 102, the insulating film 102 is formed at a high temperature of 700° C. or higher. Thus, the thermal oxide film should be formed before the ion irradiation.

Next, surface treatment is performed on the bond substrate 100 provided with the insulating film 102. The surface treatment of the insulating film 102 can be performed through cleaning with ozone water, ultrasonic cleaning using pure water, two-fluid jet cleaning using pure water and nitrogen, irradiation with an atomic beam or an ion beam, ozone treatment, plasma treatment, or radical treatment. Alternatively, the surface treatment of the insulating film 102 can be performed in combination of these methods. When an atomic beam or an ion beam is used, an inert gas neutral atom beam or an inert gas ion beam of argon or the like can be used. The ultrasonic cleaning is preferably megahertz ultrasonic cleaning (megasonic cleaning). By performing the above surface treatment, an organic substance can be removed and surface activation treatment can be performed to improve hydrophilicity of the surface of the insulating film 102. Through the above steps, the bonding strength between the bond substrate and the base substrate can be increased.

Here, an example of ozone treatment is described. For example, by irradiation with an ultraviolet (UV) ray in an atmosphere containing oxygen, ozone treatment can be performed on the surface of a process object. The ozone treatment in which irradiation with an ultraviolet ray is performed in an atmosphere containing oxygen is also referred to as UV ozone treatment, ultraviolet ray ozone treatment, or the like. By irradiation with ultraviolet light having a wavelength of lower than 200 nm and ultraviolet light having a wavelength of 200 nm or higher in an atmosphere containing oxygen, ozone can be generated and singlet oxygen can be generated from the ozone. By irradiation with ultraviolet light having a wavelength of lower than 180 nm, ozone can be generated and singlet oxygen can also be generated from the ozone.

An example of a reaction caused by irradiation with ultraviolet light having a wavelength of lower than 200 nm and ultraviolet light having a wavelength of 200 nm or higher in an atmosphere containing oxygen is shown below.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the reaction formula (1), by irradiation with ultraviolet light (hv) having a wavelength of lower than 200 nm ($\lambda_1$ nm) in an atmosphere containing oxygen ($O_2$), oxygen atoms in a ground state ($O(^3P)$) are generated. Then, in the reaction formula (2), the oxygen atom in a ground state ($O(^3P)$) and oxygen ($O_2$) react with each other; accordingly, ozone ($O_3$) is generated. Next, in the reaction formula (3), irradiation with ultraviolet light having a wavelength of 200 nm or higher ($\lambda_2$ nm) is performed in an atmosphere containing the generated ozone ($O_3$), whereby singlet oxygen in an excited state $O(^1D)$ is generated. In an atmosphere containing oxygen, by irradiation with ultraviolet light having a wavelength of lower than 200 nm, ozone is generated, and by irradiation with ultraviolet light having a wavelength of 200 nm or higher, the ozone is decomposed and singlet oxygen is generated. The above-described ozone treatment can be performed by, for example, irradiation with a low-pressure mercury lamp ($\lambda_1$=185 nm, $\lambda_2$=254 nm) in an atmosphere containing oxygen.

Further, an example of a reaction caused by irradiation with ultraviolet light having a wavelength of lower than 180 nm in an atmosphere containing oxygen is shown below.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the reaction formula (4), by irradiation with ultraviolet light having a wavelength of lower than 180 nm ($\lambda_3$ nm) in an atmosphere containing oxygen ($O_2$), singlet oxygen in an excited state $O(^1D)$ and an oxygen atom in a ground state ($O(^3P)$) are generated. Then, in the reaction formula (5), the oxygen atom in a ground state ($O(^3P)$) and oxygen ($O_2$) react with each other; accordingly, ozone ($O_3$) is generated. In the reaction formula (6), irradiation with ultraviolet light having a wavelength of lower than 180 nm ($\lambda_3$ nm) is performed in an atmosphere containing the generated ozone ($O_3$), whereby singlet oxygen in an excited state and oxygen are generated. In an atmosphere containing oxygen, by irradiation with ultraviolet light having a wavelength of lower than 180 nm, ozone is generated, and by decomposition of the ozone or oxygen, singlet oxygen is generated. The above-described ozone treatment can be performed by, for example, irradiation with a Xe excimer UV lamp ($\lambda_3$=172 nm) in an atmosphere containing oxygen.

Chemical bonds of organic substances which are attached to the surface of a process object are cut by ultraviolet light having a wavelength of lower than 200 nm. Then, organic substances which are attached to the surface of the process object, organic substances whose chemical bonds are cut, or the like can be oxidatively decomposed by ozone or singlet oxygen generated from ozone and can be removed. The above-described ozone treatment can increase a hydrophilic property and cleanliness of the surface of the process object; accordingly, bonding can be favorably performed.

By irradiation with ultraviolet rays in an atmosphere containing oxygen, ozone is generated. Ozone has an effect of removing organic substances which are attached to a surface of a process object. In addition, singlet oxygen has an effect of removing organic substances which are attached to a surface of a process object at a level equivalent to or more than the ozone. Ozone and singlet oxygen are examples of oxygen in an active state and also collectively referred to as active oxygen. As described in the above-described reaction formulae and the like, there are a reaction in which ozone is generated in generation of singlet oxygen and a reaction in which singlet oxygen is generated from ozone. Therefore, reactions to which singlet oxygen contributes are also referred to as ozone treatment here in convenience.

Next, the bond substrate 100 and the base substrate 108 to be attached are prepared. As the base substrate 108, a variety of glass substrates used in the electronics industry, such as substrates of aluminosilicate glass, barium borosilicate glass, and aluminoborosilicate glass; a quartz substrate; a ceramic substrate; a sapphire substrate; and the like can be used. Further, when an alkali-free glass substrate is used as the base substrate 108, impurity contamination of semiconductor devices can be suppressed. Furthermore, when a glass substrate is used as the base substrate 108, a glass substrate which is polished with cerium oxide or the like and whose surface has favorable planarity is preferably used. The more favorable the planarity of a surface of the base substrate 108 is, the stronger the bonding strength is. Accordingly, when a surface of the glass substrate is used as a bonding surface, the bonding strength can be increased and defective bonding can be suppressed by polishing the surface of the glass substrate.

Further, as the base substrate 108, a mother glass substrate which has been developed for manufacturing liquid crystal panels is preferably used. As such a mother glass substrate, for example, substrates having the following sizes are known: the third generation (550 mm×650 mm), the 3.5-th generation (600 mm×720 mm), the fourth generation (680 mm×880 mm or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), the tenth generation (2850 mm×3050 mm), and the like. By the use of a large-area mother glass substrate as the base substrate 108, an SOI substrate having a larger area can be obtained. If an SOI substrate having a larger area can be obtained, a large number of chips such as ICs or LSIs can be manufactured from one piece of SOI substrate and a larger number of chips can be manufactured from one piece of substrate. Accordingly, productivity can be drastically improved.

The surface of the base substrate 108 is preferably cleaned in advance. Specifically, ultrasonic cleaning (megahertz ultrasonic cleaning) is performed on the base substrate 108 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, the surface of the base substrate 108 is preferably subjected to the ultrasonic cleaning using a hydrochloric acid/hydrogen peroxide mixture. Alternatively, two-fluid jet cleaning or cleaning with ozone water may be performed. By such cleaning treatment, the surface of the base substrate 108 can be planarized and abrasive particles remaining on the surface can be removed.

Figure 2A:
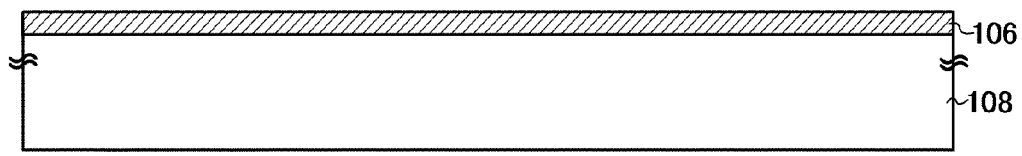
FIGS. 2A to 2C are diagrams illustrating an example of a method for manufacturing an SOI substrate according to one embodiment of the present invention.

Moreover, an insulating film 106 is preferably formed over the base substrate 108 as illustrated in FIG. 2A. As the insulating film 106, a silicon nitride film, a silicon nitride oxide film, an aluminum nitride film, an aluminum nitride oxide film, or the like which functions as a barrier film is formed over the surface of the base substrate 108, so that impurities such as an alkali metal or an alkaline earth metal can be prevented from entering the bond substrate 100 from the base substrate 108. The thickness is preferably in the range of greater than or equal to 10 nm and less than or equal to 200 nm, more preferably, greater than or equal to 50 nm and less than or equal to 100 nm. Note that the insulating film 106 is not necessarily formed over the surface of the base substrate 108.

When the insulating film 106 is formed over the base substrate 108, a surface of the insulating film 106 is preferably subjected to surface treatment such as ozone treatment and then attached to the insulating film 102 in a manner similar to that of the insulating film 102.

Figure 2B:
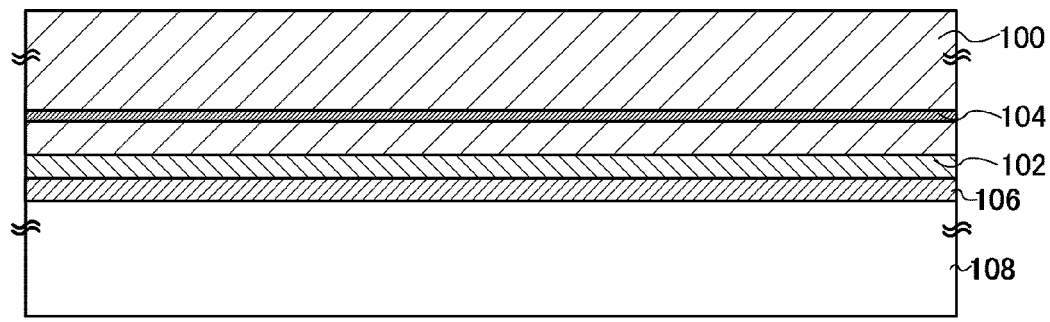

Next, as illustrated in FIG. 2B, the insulating film 102 on the surface of the bond substrate 100 and the insulating film 106 on the surface of the base substrate 108 are disposed opposite to each other and attached to each other.

For the bonding step, the insulating film 102 on the surface of the bond substrate 100 and the insulating film 106 on the surface of the base substrate 108 are disposed in close contact with each other, and then a pressure of greater than or equal to 0.1 N/cm$^2$ and less than or equal to 500 N/cm$^2$, preferably, greater than or equal to 1 N/cm$^2$ and less than or equal to 20 N/cm$^2$ is applied to a portion of the base substrate 108. From the portion at the base substrate 108 where pressure is applied, the insulating film 102 and the insulating film 106 start to bond to each other and spontaneous bonding occurs and extends to the entire area. Then, the base substrate 108 and the bond substrate 100 are attached to each other.

This bonding step is performed by the action of van der Waals force and thus a strong bond can be formed at room temperature. By applying a pressure to the bond substrate 100 and the base substrate 108, a stronger bond can be formed by a hydrogen bond. Note that because the above-described bonding can be performed at a low temperature, various substrates can be used as the base substrate 108 as described above.

After the base substrate 108 and the bond substrate 100 are attached to each other, heat treatment is preferably performed to increase bonding force at the bonding interface between the insulating film 102 and the insulating film 106. This treatment is performed at a temperature where a crack is not generated in the embrittled layer 104 and can be performed at a temperature in the range of greater than or equal to 200° C. and less than or equal to 450° C. In addition, the base substrate 108 and the bond substrate 100 may be attached to each other while heating is performed within this temperature range.

For the heat treatment, a rapid thermal anneal (RTA) apparatus, a resistance heating furnace, or a microwave heating apparatus can be used. As an RTA apparatus, a gas rapid thermal anneal (GRTA) apparatus or a lamp rapid thermal anneal (LRTA) apparatus can be used. The heat treatment for increasing bonding force at the bonding interface is preferably performed in succession in the apparatus or at the place where the attachment is performed. In addition, after the heat treatment for increasing bonding force at the bonding interface, heat treatment for separating the bond substrate 100 along the embrittled layer 104 may be successively performed.

When heat treatment is performed at such a temperature, bonding strength can usually be increased to some extent; however, sufficient bonding strength is hard to obtain. This is because, when heat treatment is performed after the bond substrate and the base substrate are bonded to each other, bond is strengthened by occurrence of a dehydration condensation reaction and formation of covalent bonds at the bonding interface, but in order to promote the dehydration condensation reaction, moisture generated at the bonding interface through the dehydration condensation reaction needs to be removed by heat treatment at a high temperature. In other words, when heat treatment after bonding is performed at a high temperature, moisture generated at the bonding interface through a dehydration condensation reaction can be removed and bonding strength can be increased. On the other hand, when heat treatment is performed at a low temperature, moisture generated at the bonding interface through a dehydration condensation reaction cannot be removed effectively; thus, the dehydration condensation reaction does not progress and bonding strength cannot be improved sufficiently.

On the other hand, when an oxide film including chlorine atoms and the like is used as the insulating film 102, moisture can be absorbed and diffused into the insulating film 102; thus, moisture generated by the dehydration reaction at a bonding interface can be absorbed and diffused into the insulating film 102 and the dehydration reaction can be promoted efficiently even if heat treatment after bonding is performed at a low temperature. In this case, even when a substrate with low heat resistance such as a glass substrate is used as a base substrate, bonding strength between the insulating film 102 and the insulating film 106 can be increased sufficiently. Further, by performing plasma treatment by applying a bias voltage, a micropore is formed in the vicinity of the surface of the insulating film 102 and moisture is effectively absorbed and diffused into the insulating film 102, and bonding strength between the insulating film 102 and the insulating film 106 can be increased even at a low temperature.

Note that if dust, particles, or the like are attached to a bonding surface in attaching the bond substrate 100 to the base substrate 108, the bond substrate 100 and the base substrate 108 are not bonded to each other at an attached portion, and the portion to which dust or particles are attached becomes a deficiency region of the semiconductor film in forming the semiconductor film 112 over the base substrate 108 by performing heat treatment on the bond substrate 100. Such a deficiency region of the semiconductor film 112 can be extended by irradiating the semiconductor film 112 with laser light in a later step. In order to prevent the contamination of the bonding surface, the attachment of the bond substrate 100 and the base substrate 108 is preferably performed in an airtight treatment chamber. In addition, at the time of attaching the bond substrate 100 to the base substrate 108, the treatment chamber may be in a state with reduced pressure of about $5.0\times10^{-3}$ Pa, and an atmosphere for the bonding treatment may be cleaned.

Figure 2C:
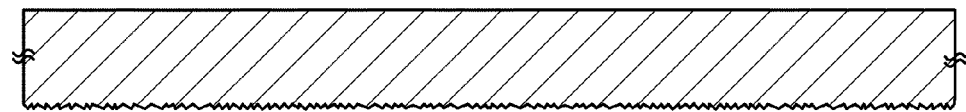
Figure 2C:
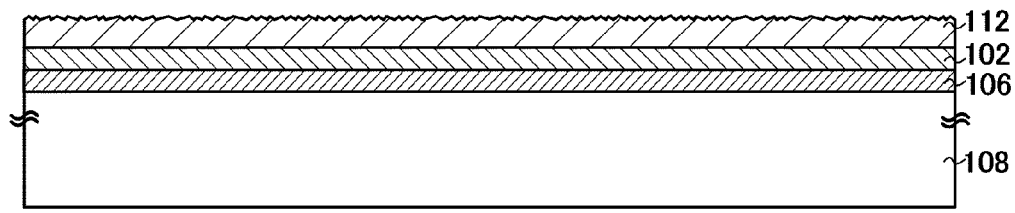

Next, as illustrated in FIG. 2C, adjacent microvoids in the embrittled layer 104 are combined with each other by heat treatment and the volume of the microvoids is increased. As a result, the bond substrate 100 is separated along the embrittled layer 104 through an explosive reaction; thus, the bond substrate 100 is separated into the semiconductor film 112 and a bond substrate 110 which has been separated. Because the insulating film 102 is bonded to the insulating film 106 on the surface of the base substrate 108, the semiconductor film 112 separated from the bond substrate 100 is fixed to the base substrate 108. The heat treatment for separating the semiconductor film 112 from the bond substrate 100 is preferably performed at a temperature which does not exceed the strain point of the base substrate 108.

As illustrated in FIG. 8A, there are an extremely large number of the microvoids 109 included in the embrittled layer 104 at a position of the average penetration depth due to the above-described ion irradiation. Thus, locally large unevenness on a separation surface is suppressed when the bond substrate 100 is separated into the semiconductor film 112 and the bond substrate 110 which has been separated. Accordingly, a locally thin region of the semiconductor film 112 over the base substrate 108 is suppressed; thus, the semiconductor film disappears at the locally thin region in irradiating the semiconductor film 112 with laser light in a later step, and the formation of a deficiency region can be suppressed.

This heat treatment can also be performed with the apparatus which is similar to the apparatus used for the heat treatment for increasing bonding force at the bonding interface. That is, a rapid thermal anneal (RTA) apparatus, a resistance heating furnace, or a microwave heating apparatus can be used for the heat treatment. As an RTA apparatus, a gas rapid thermal anneal (GRTA) apparatus or a lamp rapid thermal anneal (LRTA) apparatus can be used.

When a GRTA apparatus is used, the heating temperature can be set at 550° C. to 650° C., inclusive, and treatment time can be set for 0.5 minutes to 60 minutes, inclusive. When a resistance heating apparatus is used, the heating temperature can be set at 200° C. to 650° C., inclusive, and treatment time can be set for two hours to four hours, inclusive.

In addition, the above-described heat treatment may be performed by dielectric heating with a high-frequency wave such as a microwave. The heat treatment by dielectric heating can be performed by irradiating the bond substrate 100 with a high-frequency wave with a frequency of greater than or equal to 300 MHz and less than or equal to 3 THz generated by a high-frequency wave generating apparatus. Specifically, for example, irradiation with a microwave with a frequency of 2.45 GHz at 900 W is performed for 14 minutes to combine adjacent microvoids in the embrittled layer, whereby the bond substrate 100 can be separated lastly.

Further, it is preferable that the bond substrate 110 which has been separated be subjected to chemical mechanical polishing (CMP) or the like and be used again as the bond substrate 100. The reused semiconductor substrate may be used for other applications.

The semiconductor film 112 illustrated in FIG. 2C is irradiated with hydrogen ions having the dose of hydrogen ions which is more than the dose of hydrogen ions of the lower limit for separation of the bond substrate 100; thus, locally large unevenness can be suppressed. However, crystal defects are formed on the surface and planarity is deteriorated by separation of the bond substrate 100 due to the above-described ion irradiation or heat treatment. It is difficult to obtain a gate insulating film having high dielectric strength even if a gate insulating film is formed over the semiconductor film 112 whose surface is in such a state. Further, if there are crystal defects in the semiconductor film 112, an adverse effect is caused, for example, a localized level density at the interface with the gate insulating film increases. Thus, recovery of crystallinity and planarization treatment of the semiconductor film 112 are conducted by irradiation with laser light. Furthermore, in addition to the laser light irradiation of the semiconductor film 112, it is preferable that etching treatment be combined.

Moreover, a natural oxide film is formed on a surface of the semiconductor film 112 in many cases. Even if the semiconductor film 112 is irradiated with laser light with the natural oxide film formed, it is difficult to obtain effects in recovery of crystallinity and planarization of the surface of the semiconductor film sufficiently. Thus, the natural oxide film is preferably removed before the semiconductor film 112 is irradiated with laser light.

The natural oxide film can be removed by etching treatment, and dry etching is preferably used. When the natural oxide film is removed by wet etching, if there are minute chinks in the semiconductor film 112, the insulating film 102, and the insulating film 106, there is a risk that a chemical solution may erode the base substrate 108 through the minute chinks or pores and form a cavity in the base substrate 108. If the SOI substrate in which a cavity is formed in the base substrate 108 is irradiated with laser light, the air in the cavity is heated, its volume expands, and the semiconductor film 112 on the cavity is blown, so that a deficiency region might be formed in the semiconductor film 112.

The etching treatment for removing the natural oxide film is not particularly limited as long as it is dry etching. The etching treatment before irradiation with the laser light is not particularly limited as long as dry etching can be conducted. For example, a reactive ion etching (RIE) method, an inductively coupled plasma (ICP) etching method, an electron cyclotron resonance (ECR) etching method, a parallel plate (capacitive coupled plasma) etching method, a magnetron plasma etching method, a dual-frequency plasma etching method, a helicon wave plasma etching method, or the like can be used. Etching can be conducted by using, for example, a chlorine-based gas such as $Cl_2$, $BCl_3$, or $SiCl_4$; a fluorine-based gas such as $CHF_3$, $CF_4$, $C_4F_8$, $C_2F_6$, $NF_3$, or sulfur fluoride; or a boron-based gas such as HBr as an etching gas. Further, an inert gas such as He, Ar, or Xe, $O_2$, or $H_2$ can be used. These etching gases can be used alone or in combination. For example, when an ICP etching method is used, etching may be performed under the following conditions: the flow rate of argon, which is an etching gas, is 100 sccm; power applied to a coil electrode is 500 W; power applied to a lower electrode (on the bias side) is 100 W; and the reaction pressure is 1.35 Pa.

Further, the natural oxide film may be removed and then the surface of the semiconductor film 112 may be removed in order to remove crystal defects and unevenness formed on the surface of the semiconductor film 112. The crystal defects on the surface of the semiconductor film 112 is removed before the irradiation with laser light, so that the crystal defects can be prevented from being taken into the semiconductor film in the irradiation with laser light. As a method for removing the surface of the semiconductor film 112, etching treatment may be conducted in a manner similar to the removal of the natural oxide film, and dry etching is preferably used. As for the details of the dry etching, dry etching may be conducted in a manner similar to the above-described dry etching of the natural oxide film.

Figure 3A:
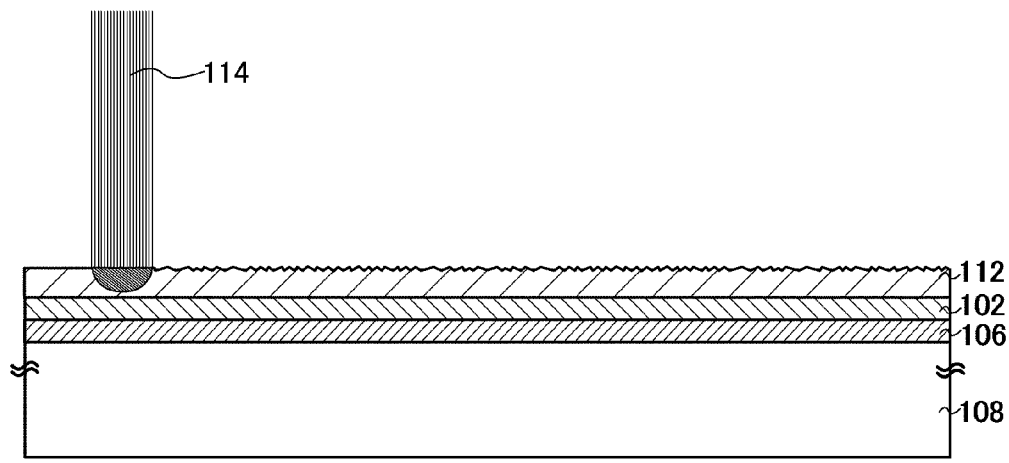
FIGS. 3A to 3C are diagrams illustrating an example of a method for manufacturing an SOI substrate according to one embodiment of the present invention.
Figure 3B:
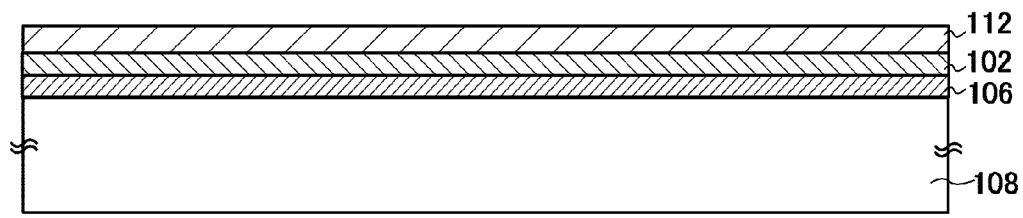

Next, as illustrated in FIG. 3A, the semiconductor film 112 is irradiated with laser light 114. By irradiating the semiconductor film 112 with the laser light 114, the semiconductor film 112 can be melted. A portion in the semiconductor film 112 which is melted by irradiation with the laser light 114 is cooled and solidified, whereby the planarity of the semiconductor film 112 is improved and the crystal defects of the semiconductor film 112 are repaired as illustrated in FIG. 3B. By heating the semiconductor film 112 with the laser light 114, the base substrate 108 is not directly heated; thus, increase in the temperature of the base substrate 108 can be suppressed. Therefore, a substrate having low heat resistance such as a glass substrate can be used as the base substrate 108.

It is preferable that the semiconductor film 112 be partially melted by the irradiation with the laser light 114. This is because if the semiconductor film 112 is completely melted, the recrystallization of the semiconductor film 112 is accompanied with disordered nucleation of the semiconductor film 112 in a liquid phase and crystallinity of the semiconductor film 112 is lowered. By partial melting, so-called longitudinal growth in which crystal growth proceeds from a solid portion which is not melted occurs in the semiconductor film 112. Due to the recrystallization by the longitudinal growth, crystal defects of the semiconductor film 112 are reduced and crystallinity thereof is recovered. Note that the state where the semiconductor film 112 is completely melted indicates that the semiconductor film 112 is melted to be in a liquid state to an interface with the insulating film 102. On the other hand, the state where the semiconductor film 112 is partially melted indicates that an upper layer thereof is melted and is in a liquid phase and a lower layer thereof is in a solid phase.

Here, when the semiconductor film 112 is irradiated with the laser light 114, if a region where the thickness is locally small is formed in the semiconductor film 112, ablation is caused at the region where the thickness of the semiconductor film 112 is locally small due to the irradiation with the laser light 114, so that a deficiency region is caused in the semiconductor film 112.

However, in this embodiment, as described above, the dose of hydrogen ions in forming the embrittled layer 104 by ion irradiation is set to a value more than the dose of hydrogen ions of the lower limit for separation of the bond substrate 100, preferably, a dose 2.2 times or more as high as the lower limit of the dose of hydrogen ions for separation of the bond substrate. Thus, the number of microvoids included in the embrittled layer 104 is increased and the number of microvoids which is formed at a position of the average penetration depth is remarkably increased, as compared with the number of microvoids which deviate from a position of the average penetration depth. Therefore, the microvoids formed at a position of the average penetration depth are easily combined with each other when the bond substrate 100 is separated into the semiconductor film and the bond substrate which has been separated by heat treatment; therefore, a region where the thickness of the semiconductor film 112 formed over the base substrate 108 is locally small is reduced. Accordingly, a deficiency region of the semiconductor film 112 caused by ablation can be suppressed by irradiating the semiconductor film 112 with the laser light 114.

A laser emitting the laser light 114 may be a continuous wave laser, a quasi-continuous wave laser, or a pulsed laser, but a pulsed laser is preferably used. This is because a pulsed laser can instantaneously emit a pulsed laser beam with high energy, with which a melted state can easily be created.

As the laser, for example, a gas laser such as an excimer laser like a KrF laser, an Ar laser, or a Kr laser can be used. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser may be used. Note that an excimer laser is a pulsed laser, and some solid lasers such as a YAG laser can be used as a continuous wave laser, a quasi-continuous wave laser, and a pulsed laser.

A wavelength of the laser light is set to be a wavelength which is absorbed in the semiconductor film 112 and can be determined in consideration of the skin depth of the laser light and the like. For example, the wavelength can be in the range of greater than or equal to 250 nm and less than or equal to 700 nm. Further, the energy of the laser light can be determined in consideration of the wavelength of the laser light, the skin depth of the laser light, the thickness of the semiconductor film 112, and the like. The energy of the laser light can be, for example, in the range of 300 $mJ/cm^2$ to 1 $J/cm^2$, inclusive. Irradiation with laser light can be performed in an atmosphere containing oxygen such as the atmospheric air or an inert atmosphere such as a nitrogen atmosphere. An inert atmosphere such as nitrogen can more effectively improve planarity of the semiconductor film 112 than the atmospheric air.

Note that in irradiation with laser light, the semiconductor film 112 over the base substrate 108 may be heated to increase the temperature of the semiconductor film 112. The heating temperature is preferably 400° C. to 700° C., inclusive; more preferably, 450° C. to 650° C., inclusive.

For example, the irradiation step with the laser light 114 can be performed in the following manner. As a laser emitting the laser light 114, a XeCl excimer laser (wavelength: 308 nm, pulse width: 25 nanoseconds, and repetition rate: 30 Hz) is used. The cross section of the laser light 114 is shaped into a linear shape with a size of 150 mm×0.34 mm through an optical system. The semiconductor film 112 is irradiated with the laser light 114 with a scanning speed of the laser light 114 of 10 mm/second, a scanning pitch of 33 μm, and the number of shots of about 10. The energy density is 852 mJ/cm$^2$. An irradiation surface is scanned with the laser light 114 while the surface is sprayed with a nitrogen gas.

Figure 3C:
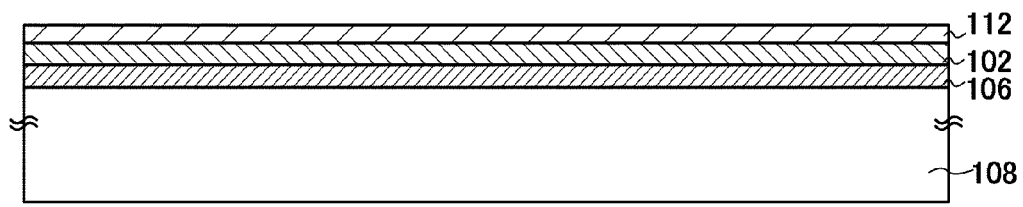

Next, as illustrated in FIG. 3C, it is preferable that thinning treatment be performed for reducing the thickness of the semiconductor film 112 to a thickness which is optimal for a semiconductor device to be formed later. As the thinning treatment, dry etching is preferably performed in a manner similar to the above-described removal of the natural oxide film. The dry etching may also be performed as appropriate depending on a desired thickness in a manner similar to the dry etching of the natural oxide film. For example, when the semiconductor film 112 is formed using single crystal silicon, dry etching may be performed using $SF_6$ as a process gas.

After the irradiation with laser light, the semiconductor film 112 is preferably subjected to heat treatment at 500° C. to 700° C., inclusive. This heat treatment can eliminate defects of the semiconductor film 112 which have not been repaired in the irradiation with the laser light and can reduce distortion of the semiconductor film 112. For the heat treatment, a rapid thermal anneal (RTA) apparatus, a resistance heating furnace, or a microwave heating apparatus can be used. As an RTA apparatus, a gas rapid thermal anneal (GRTA) apparatus or a lamp rapid thermal anneal (LRTA) apparatus can be used. For example, when a resistance heating furnace is used, heat treatment may be performed at 600° C. for about four hours.

Through the above steps, as illustrated in FIG. 3C, an SOI substrate in which the semiconductor film 112 is formed over the base substrate 108 with the insulating film 106 and the insulating film 102 interposed therebetween can be manufactured. By using the method for manufacturing the SOI substrate described in this embodiment, an SOI substrate having a single crystal semiconductor film in which crystal defects are repaired, planarity is improved, and a single crystal semiconductor film whose deficiency regions are reduced over a substrate having low heat resistance such as a glass substrate can be manufactured. In addition, with the use of such a semiconductor substrate, a semiconductor device with excellent element characteristics can be manufactured.

Embodiment 2

In this embodiment, a semiconductor device is manufactured using the SOI substrate manufactured in Embodiment 1. A method for manufacturing an n-channel thin film transistor and a p-channel thin film transistor is described with reference to FIGS. 4A to 4D, FIGS. 5A to 5C, and FIGS. 6A to 6C. By combining a plurality of thin film transistors (TFTs), various types of semiconductor devices can be manufactured.

First, a p-type impurity element such as boron, aluminum, or gallium or an n-type impurity element such as phosphorus or arsenic is preferably added to the semiconductor film 112 in accordance with a formation region of an n-channel thin film transistor or a p-channel thin film transistor. For example, a p-type impurity element is added to a formation region of an n-channel thin film transistor and an n-type impurity element is added to a formation region of a p-channel thin film transistor, whereby so-called well regions are formed. The dose of impurity ions may be about greater than or equal to $1\times10^{12}$ ions/cm$^2$ and less than or equal to $1\times10^{14}$ ions/cm$^2$. Furthermore, in order to control the threshold voltage of a thin film transistor, a p-type impurity element or an n-type impurity element may be added to these well regions.

Figure 4A:
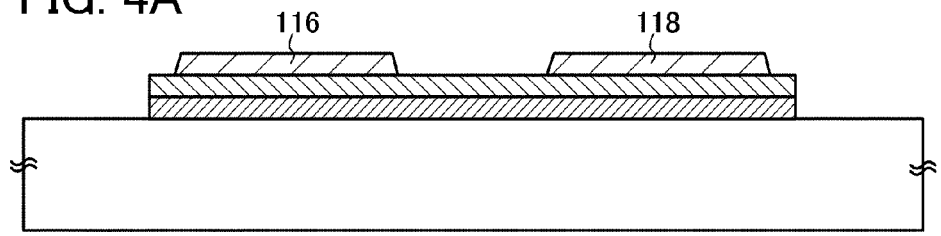
FIGS. 4A to 4D are diagrams illustrating an example of a method for manufacturing a semiconductor device according to one embodiment of the present invention.

Next, the semiconductor film 112 is isolated for each element by etching, so that a semiconductor film 116 and a semiconductor film 118 are formed as illustrated in FIG. 4A. In this embodiment, the semiconductor film 116 is included in an n-channel TFT and the semiconductor film 118 is included in a p-channel TFT.

Figure 4B:
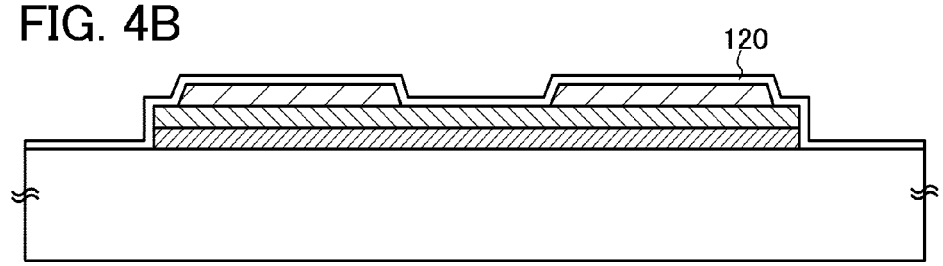

As illustrated in FIG. 4B, a gate insulating film 120 is formed so as to cover the semiconductor film 116, the semiconductor film 118, the insulating film 102, and the base substrate 108. The gate insulating film 120 is preferably formed to have a single-layer structure or a stacked-layer structure of an insulating film containing any of silicon oxide, silicon oxynitride, silicon nitride oxide, silicon nitride, hafnium oxide, aluminum oxide, tantalum oxide, and the like by a plasma-enhanced CVD method.

As a manufacturing method other than a plasma-enhanced CVD method, a sputtering method or a method using oxidation or nitridation of the semiconductor film 116 and the semiconductor film 118 by high-density plasma treatment can be given. High-density plasma treatment is performed by using, for example, a mixed gas of a rare gas such as helium, argon, krypton, or xenon; and a gas such as oxygen, nitrogen oxide (including nitrous oxide), ammonia, nitrogen, or hydrogen. In this case, by plasma excitation by introduction of microwaves, plasma at a low electron temperature and high density can be generated. Surfaces of the semiconductor layers are oxidized or nitrided by oxygen radicals (OH radicals may be included) or nitrogen radicals (NH radicals may be included) which are generated by such a high-density plasma, whereby an insulating layer is formed to a thickness of greater than or equal to 1 nm and less than or equal to 20 nm, preferably, greater than or equal to 2 nm and less than or equal to 10 nm so as to be in contact with the semiconductor layers. Note that when the gate insulating film 120 is formed by oxidizing or nitriding the semiconductor film 116 and the semiconductor film 118 by high-density plasma treatment, the gate insulating film 120 is formed so as to cover only the semiconductor film 116 and the semiconductor film 118, which is different from FIG. 4B.

Because the oxidation or nitridation of the semiconductor layers by the above-described high-density plasma treatment is a solid-phase reaction, the interface state density between the gate insulating film 120 and each of the semiconductor film 116 and the semiconductor film 118 can be drastically reduced. Further, by directly oxidizing or nitriding the semiconductor layers by high-density plasma treatment, variations in the thickness of the insulating layer to be formed can be suppressed. Because the semiconductor layers have crystallinity, even when surfaces of the semiconductor layers are oxidized by a solid-phase reaction by using the high-density plasma treatment, nonuniform oxidation in a crystal grain boundary can be suppressed; thus, a gate insulating layer with favorable uniformity and a low interface state density can be formed. When an insulating film formed by high-density plasma treatment as described above is used for a part of or the whole gate insulating film of a transistor, variations in characteristics can be suppressed.

A more specific example of a method for manufacturing an insulating film by plasma treatment is described. The surfaces of the semiconductor film 116 and the semiconductor film 118 are oxidized or nitrided in such a manner that nitrous oxide ($N_2O$) is diluted to be greater than or equal to 1 time and less than or equal to 3 times (the flow ratio) with argon (Ar) and a microwave power (2.45 GHz) of greater than or equal to 3 kW and less than or equal to 5 kW is applied under a pressure of greater than or equal to 10 Pa and less than or equal to 30 Pa. By this treatment, a lower layer of the gate insulating film 120 with a thickness of greater than or equal to 1 nm and less than or equal to 10 nm (preferably, greater than or equal to 2 nm and less than or equal to 6 nm) is formed. Further, a silicon oxynitride film is formed as an upper layer of the gate insulating film 120 by a vapor-phase growth method in such a manner that nitrous oxide ($N_2O$) and silane ($SiH_4$) are introduced and microwave power (2.45 GHz) of greater than or equal to 3 kW and less than or equal to 5 kW is applied under a pressure of greater than or equal to 10 Pa and less than or equal to 30 Pa. By combination of solid-phase reaction and reaction by a vapor deposition method, the gate insulating film 120 having low interface state density and excellent dielectric strength can be formed. Note that the gate insulating film 120 in this case has a two-layer structure.

Alternatively, the gate insulating film 120 may be formed by thermally oxidizing the semiconductor film 116 and the semiconductor film 118. In the case of forming the gate insulating film 120 by such thermal oxidation, a base substrate with a comparatively high heat resistance is preferably used. Note that when the gate insulating film 120 is formed by thermal oxidation of the semiconductor film 116 and the semiconductor film 118, the gate insulating film 120 is formed so as to cover only the semiconductor film 116 and the semiconductor film 118, which is different from FIG. 4B.

Note that the gate insulating film 120 forms an interface with the semiconductor layers; thus, the gate insulating film 120 is preferably formed so that a silicon oxide film or a silicon oxynitride film is located at the interface. This is because, if a film in which the amount of nitrogen is larger than that of oxygen, such as a silicon nitride film or a silicon nitride oxide film, is formed, there might occur a problem in interface characteristics due to generation of trap levels.

Further alternatively, after the gate insulating film 120 containing hydrogen is formed, hydrogen contained in the gate insulating film 120 may be dispersed in the semiconductor film 116 and the semiconductor film 118 by performing heat treatment at a temperature of greater than or equal to 350° C. and less than or equal to 450° C. In this case, the gate insulating film 120 may be formed by depositing silicon nitride or silicon nitride oxide by a plasma-enhanced CVD method. Further, in this case, a process temperature may be set to less than or equal to 350° C. By supplying hydrogen to the semiconductor film 116 and the semiconductor film 118 in the above-described manner, defects in the semiconductor film 116, in the semiconductor film 118, at an interface between the gate insulating film 120 and the semiconductor film 116, and at an interface between the gate insulating film 120 and the semiconductor film 118 can be effectively reduced.

Figure 4C:
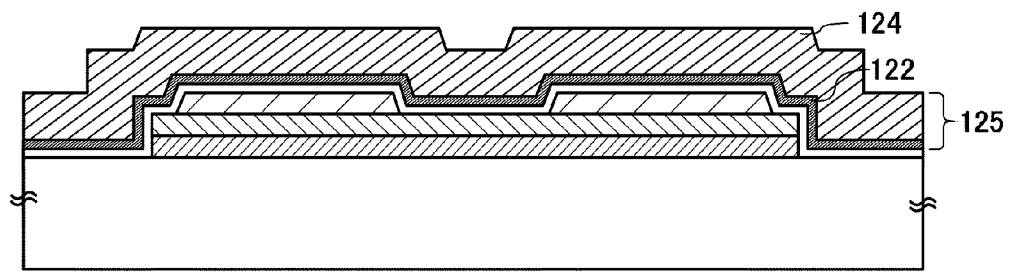

Next, as illustrated in FIG. 4C, a first conductive film 122 is formed so as to cover the gate insulating film 120, and a second conductive film 124 is formed so as to cover the first conductive film 122, so that a stacked-layer conductive film 125 having a two-layer structure is formed. The first conductive film 122 and the second conductive film 124 are included in a gate electrode and are stacked-layer conductive films which have a two-layer structure. Here, it is preferable that the first conductive film 122 have a compressive stress and the second conductive film 124 have a tensile stress whose value is equivalent to that of the compressive stress. Further, the first conductive film 122 may have a tensile stress and the second conductive film 124 have a compressive stress whose value is equivalent to that of the tensile stress. In such a manner, by relieving the stress of the first conductive film 122 with the stress of the second conductive film 124, the first conductive film 122 and the second conductive film 124 can be prevented from being separated due to the stress.

The first conductive film 122 and the second conductive film 124 can be formed using a conductive material such as an element selected from tungsten, tantalum, titanium, molybdenum, aluminum, copper, chromium, or niobium; an alloy material or a compound material containing such an element; or a semiconductor material typified by polycrystalline silicon doped with an impurity element such as phosphorus. In this case, a conductive material and deposition conditions may be selected as appropriate such that the stress of the first conductive film 122 is relieved by the stress of the second conductive film 124. A stacked-layer structure is formed using the above conductive material by a sputtering method or a CVD method. The stacked-layer structure of the conductive film is not limited to a two-layer structure, and the stacked-layer structure may include three or more layers. Further, a single-layer conductive film may be used instead of the stacked-layer conductive film 125. In this embodiment, the stacked-layer conductive film 125 which forms the gate electrode is formed to have a two-layer structure including the first conductive film 122 and the second conductive film 124.

When a gate electrode is formed to have a two-layer structure including the first conductive film 122 and the second conductive film 124 as described in this embodiment, a stacked-layer structure including, for example, a tantalum nitride layer and a tungsten layer, a titanium nitride layer and a tungsten layer, a molybdenum nitride layer and a molybdenum layer, or the like can be formed. A stacked-layer structure including a tantalum nitride layer and a tungsten layer is preferable because etching rates of the two layers are easily differentiated from each other and high selectivity of etching between the two layers can be obtained. Note that it is preferable that the above-described layer (for example, a tantalum nitride layer) of the stacked-layer conductive film 125 including two layers which is exemplified be formed on and in contact with the gate insulating film 120. For example, the first conductive film 122 is formed to a thickness of greater than or equal to 20 nm and less than or equal to 100 nm, and the second conductive film 124 is formed to a thickness of greater than or equal to 100 nm and less than or equal to 400 nm.

Next, a resist mask 126 and a resist mask 128 are selectively formed over the second conductive film 124. Then, the first conductive film 122 and the second conductive film 124 are subjected to first etching treatment and second etching treatment with the use of the resist mask 126 and the resist mask 128.

Figure 4D:
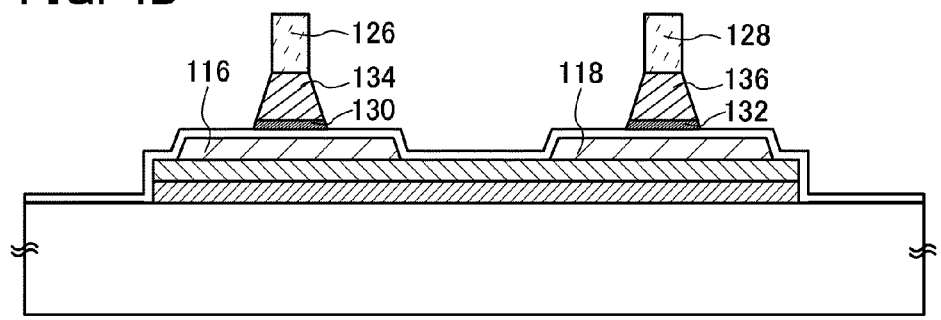

First, as illustrated in FIG. 4D, by the first etching treatment using the resist mask 126 and the resist mask 128, the first conductive film 122 and the second conductive film 124 are selectively etched so as to form a first conductive film 130 and a second conductive film 134 over the semiconductor film 116, and a first conductive film 132 and a second conductive film 136 over the semiconductor film 118. In the first etching treatment, the first conductive films 130 and 132 and the second conductive films 134 and 136 are etched to have a tapered (tilt) shape.

Figure 5A:
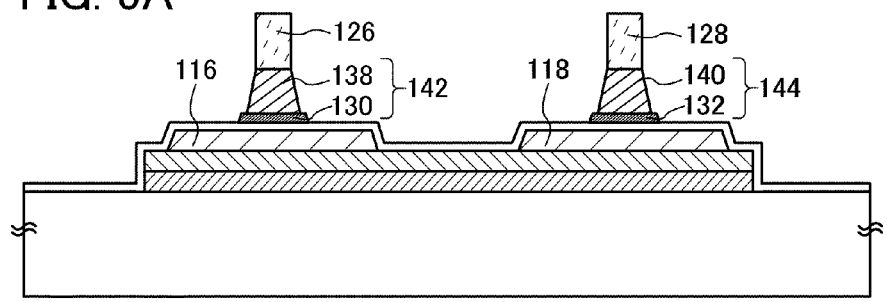
FIGS. 5A to 5C are diagrams illustrating an example of a method for manufacturing a semiconductor device according to one embodiment of the present invention.

Next, as illustrated in FIG. 5A, the second conductive films 134 and 136 are selectively etched in the second etching treatment using the resist mask 126 and the resist mask 128 so as to form a second conductive film 138 over the semiconductor film 116 and a second conductive film 140 over the semiconductor film 118. In the second etching treatment, the second conductive films 138 and 140 are etched to have a near-perpendicularly tapered shape by anisotropic etching. Further, the second conductive film 138 is formed so as to have a smaller width than the first conductive film 130. In a similar manner, the second conductive film 140 is formed so as to have a smaller width than the first conductive film 132. Here, the term "width" refers to a length in a direction parallel to a direction in which carriers flow in a channel formation region (a direction connecting a source region and a drain region). In such a manner, a gate electrode 142 with a two-layer structure including the first conductive film 130 and the second conductive film 138 and a gate electrode 144 with a two-layer structure including the first conductive film 132 and the second conductive film 140 are formed.

An etching method employed for the first etching treatment and the second etching treatment may be selected as appropriate. In order to increase etching rate, a dry etching apparatus using a high-density plasma source such as an electron cyclotron resonance (ECR) method or an inductive coupled plasma (ICP) method is preferably used. With appropriate control of the etching conditions (power applied to a coiled electrode, power applied to an electrode on the substrate side, the temperature of the electrode on the substrate side, and the like) of the first etching treatment and the second etching treatment, side surfaces of the first conductive films 130 and 132 and the second conductive films 138 and 140 each can have a desired tapered shape. After the gate electrodes 142 and 144 are formed as desired, the resist masks 126 and 128 may be removed.

Figure 5B:
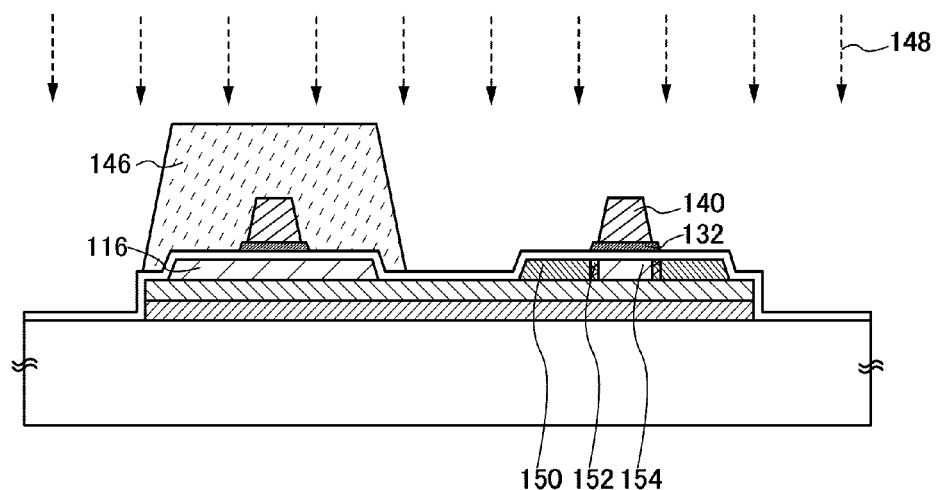

Next, as illustrated in FIG. 5B, a resist mask 146 is selectively formed so as to cover the semiconductor film 116. Then, a p-type impurity element 148 is added to the semiconductor film 118 using the resist mask 146. A pair of high-concentration impurity regions 150, a pair of low-concentration impurity regions 152, and a channel formation region 154 are formed over the semiconductor film 118 in a self-aligned manner with the first conductive film 132 and the second conductive film 140 which are formed over the semiconductor film 118 used as masks.

Here, in order to form a p-channel field-effect transistor over the semiconductor film 118, the p-type impurity element 148 such as boron, aluminum, or gallium is added. Here, in order to form a p-channel field-effect transistor, boron is added as the p-type impurity element 148. Further, boron is added to the high-concentration impurity regions 150 such that boron is contained at a concentration of about greater than or equal to $1\times10^{20}$ atoms/cm$^3$ and less than or equal to $5\times10^{21}$ atoms/cm$^3$. The high-concentration impurity regions 150 serve as a source region and a drain region.

In the semiconductor film 118, the high-concentration impurity regions 150 are formed in a region which does not overlap with the first conductive film 132, the low-concentration impurity regions 152 are formed in a region which overlaps with the first conductive film 132 and does not overlap with the second conductive film 140, and the channel formation region 154 is formed in a region which overlaps with the second conductive film 140. The low-concentration impurity regions 152 contain impurities at a lower concentration than the high-concentration impurity regions 150.

Figure 5C:
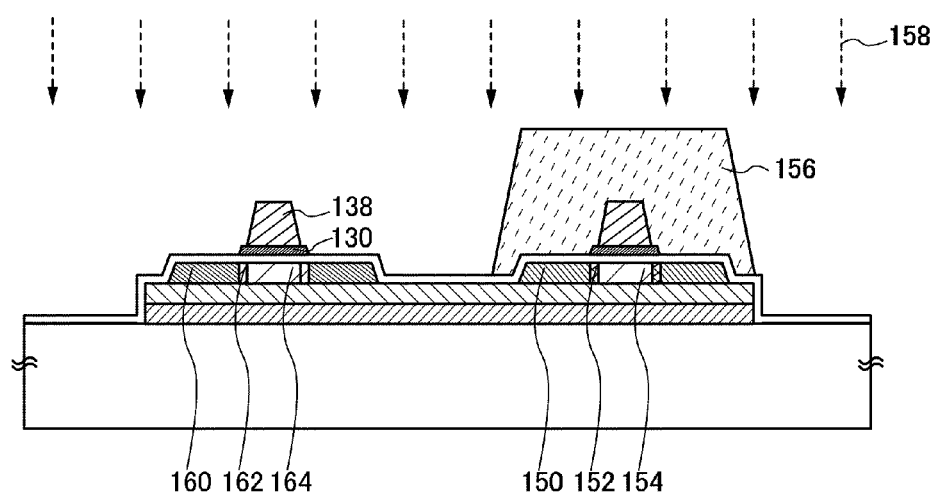

After the resist mask 146 is removed, as illustrated in FIG. 5C, a resist mask 156 is selectively formed so as to cover the semiconductor film 118. Then, an n-type impurity element 158 is added to the semiconductor film 116 using the resist mask 156. A pair of high-concentration impurity regions 160, a pair of low-concentration impurity regions 162, and a channel formation region 164 are formed over the semiconductor film 116 in a self-aligned manner with the first conductive film 130 and the second conductive film 138 which are formed over the semiconductor film 116 used as masks.

Here, in order to form an n-channel field-effect transistor over the semiconductor film 116, the n-type impurity element 158 such as phosphorus or arsenic is added. For example, phosphorus is added to the high-concentration impurity regions 160 as the n-type impurity element 158 such that phosphorus is contained at a concentration of about greater than or equal to $5\times10^{19}$ atoms/cm$^3$ and less than or equal to $5\times10^{20}$ atoms/cm$^3$. The high-concentration impurity regions 160 serve as a source region and a drain region.

In the semiconductor film 116, the high-concentration impurity regions 160 are formed in a region which does not overlap with the first conductive film 130, the low-concentration impurity regions 162 are formed in a region which overlaps with the first conductive film 130 and does not overlap with the second conductive film 138, and the channel formation region 164 is formed in a region which overlaps with the second conductive film 138. The low-concentration impurity regions 162 contain impurities at a lower concentration than the high-concentration impurity regions 160.

Note that the order of forming the high-concentration impurity regions 150, the low-concentration impurity regions 152, and the channel formation region 154 over the semiconductor film 118, the order of forming the high-concentration impurity regions 160, the low-concentration impurity regions 162, and the channel formation region 164 over the semiconductor film 116, and the like are not limited to the formation order described in this embodiment and can be changed as appropriate. Further, after impurity regions (the high-concentration impurity regions 150, the low-concentration impurity regions 152, the high-concentration impurity regions 160, and the low-concentration impurity regions 162) are formed over the semiconductor film 116 and the semiconductor film 118, heat treatment, laser beam irradiation, and the like are preferably performed as appropriate for activation (reduction in resistance).

Figure 6A:
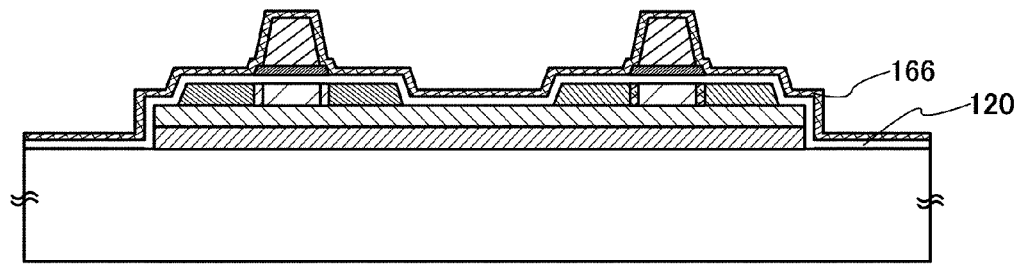
FIGS. 6A to 6C are diagrams illustrating an example of a method for manufacturing a semiconductor device according to one embodiment of the present invention.

Next, as illustrated in FIG. 6A, an insulating film 166 is formed so as to cover the gate electrode 142, the gate electrode 144, and the gate insulating film 120. As the insulating film 166, a silicon oxide film, a silicon oxynitride film, a silicon nitride oxide film, a silicon nitride oxide film, or the like is formed by a CVD method or a sputtering method. For example, a silicon oxynitride film (thickness is 50 nm) is formed by a plasma-enhanced CVD method as the insulating film 166. Then, heat treatment is performed at a temperature of greater than or equal to 400° C. and less than or equal to the strain point of the base substrate 108, so that impurity regions (the high-concentration impurity regions 150, the low-concentration impurity regions 152, the high-concentration impurity regions 160, and the low-concentration impurity regions 162) can be activated. For example, heat treatment is performed in a nitrogen atmosphere at 480° C. for one hour. By performing heat treatment after formation of the insulating film 166, oxidation of the gate electrodes due to the heat treatment can be prevented. Further, by controlling the atmosphere in the heat treatment, oxidation of the gate electrodes can also be prevented without forming the insulating film 166.

Figure 6B:
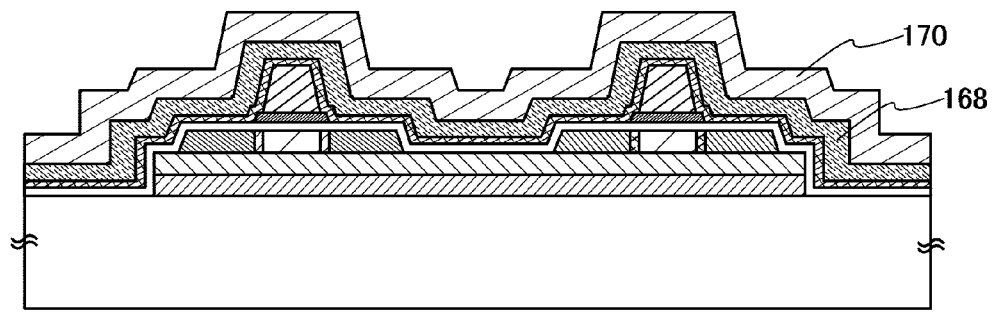

Then, as illustrated in FIG. 6B, a first interlayer insulating film 168 and a second interlayer insulating film 170 are formed over the insulating film 166. As the first interlayer insulating film 168 and the second interlayer insulating film 170, a silicon oxide layer, a silicon oxynitride layer, a silicon nitride layer, a silicon nitride oxide layer, or the like can be formed by a CVD method or a sputtering method. Further, the first interlayer insulating film 168 and the second interlayer insulating film 170 can also be formed by an application method such as a spin coating method, using an organic material such as polyimide, polyamide, polyvinylphenol, benzocyclobutene, acrylic, or epoxy, a siloxane material such as a siloxane resin, an oxazole resin, or the like. Note that the siloxane material corresponds to a material having Si—O—Si bonds.

In addition, it is preferable that as an insulating film formed as an upper layer of the gate electrodes 142 and 144, at least one insulating film containing hydrogen be formed and heat treatment be performed in order to terminate dangling bonds in the single crystal semiconductor film with hydrogen. When heat treatment is performed at a process temperature of, for example, greater than or equal to 350° C. and less than or equal to 470° C., preferably, greater than or equal to 400° C. and less than or equal to 450° C. after the insulating film containing hydrogen is formed, hydrogen contained in the insulating film is thermally excited by the heat treatment and diffused, and the hydrogen passes through the insulating film and reaches the single crystal semiconductor film. Then, dangling bonds in the single crystal semiconductor film are terminated with the hydrogen that reaches the single crystal semiconductor film. If there are dangling bonds in a semiconductor layer, particularly in a channel formation region, the dangling bonds can adversely affect electrical characteristics of a completed transistor. Thus, hydrogen termination described in this embodiment is effective. The hydrogen termination can improve interface characteristics between the gate insulating film and the single crystal semiconductor film.

The insulating film containing hydrogen can be formed by a plasma-enhanced CVD method using a process gas for deposition containing hydrogen. Even when the insulating film containing hydrogen is not formed, heat treatment performed in an atmosphere containing hydrogen enables termination of dangling bonds with hydrogen in the single crystal semiconductor film. For example, an insulating film containing hydrogen is formed as the first interlayer insulating film 168, and the second interlayer insulating film 170 is formed thereover. Then, heat treatment for hydrogen termination is performed. In this case, the second interlayer insulating film 170 are formed under deposition conditions which does not cause dehydrogenation of the first interlayer insulating film 168.

For example, a silicon nitride oxide film (thickness is 300 nm) as the first interlayer insulating film 168 and a silicon oxynitride film (thickness is 450 nm) as the second interlayer insulating film 170 are sequentially formed by a plasma-enhanced CVD method. As a process gas for forming the silicon nitride oxide film, monosilane, ammonia, hydrogen, and nitrogen oxide are used. As a process gas for forming the silicon oxynitride film, monosilane and nitrogen oxide are used. Further, when the process temperature is about greater than or equal to 200° C. and less than or equal to 300° C., an insulating film can be formed without dehydrogenation of the silicon nitride oxide film. Then, after the second interlayer insulating film 170 is formed, heat treatment is performed at 410° C. in a nitrogen atmosphere for one hour, thereby terminating the single crystal semiconductor film with hydrogen.

Figure 6C:
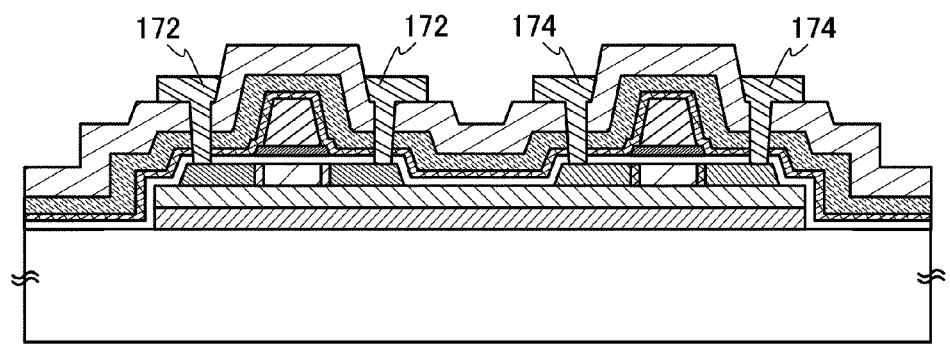

Next, as illustrated in FIG. 6C, contact holes are formed in the second interlayer insulating film 170, the first interlayer insulating film 168, the insulating film 166, and the gate insulating film 120, and wirings 172 and wirings 174 are formed so as to fill the contact holes. Here, a pair of contact holes is formed so as to reach a pair of the high-concentration impurity regions 160, respectively, and a pair of the wirings 172 which reach the high-concentration impurity regions 160 through the contact holes is formed. At the same time, a pair of contact holes is formed so as to reach a pair of the high-concentration impurity regions 150, respectively, and a pair of the wirings 174 which reach the high-concentration impurity regions 150 through the contact holes is formed. The wirings 172 and the wirings 174 serve as source electrodes and drain electrodes. The wirings 172 are electrically connected to the high-concentration impurity regions 160. The wirings 174 are electrically connected to the high-concentration impurity regions 150.

The wirings 172 and the wirings 174 can be formed using an element selected from aluminum, tungsten, titanium, tantalum, molybdenum, nickel, neodymium, copper, or the like, or an alloy material or compound material which contains any of these elements. As the alloy material containing any of the above-described elements, an aluminum alloy containing titanium, an aluminum alloy containing neodymium, an aluminum alloy containing silicon (also referred to as aluminum silicon), or the like can be given for example. As the compound material containing any of the above-described elements, a nitride such as tungsten nitride, titanium nitride, tantalum nitride, or the like can be given. The wirings 172 and the wirings 174 may be formed over the entire surface using the above-described material by a sputtering method or a CVD method and then may be formed into a desired shape by selective etching. Further, the wirings 172 and the wirings 174 can have a single-layer structure or a stacked-layer structure including two or more layers. For example, a structure in which a titanium layer, a titanium nitride layer, an aluminum layer, and a titanium layer are sequentially stacked in this order can be employed. By forming an aluminum layer between titanium layers, heat resistance can be increased. Further, a titanium nitride layer formed between a titanium layer and an aluminum layer can function as a barrier layer.

Through the above steps, a semiconductor device having the n-channel TFT and the p-channel TFT can be manufactured using the SOI substrate having the single crystal semiconductor film.

In a process for manufacturing the SOI substrate used for the semiconductor device in this embodiment, the SOI substrate is provided with the single crystal semiconductor film in which crystal defects are repaired, planarity is improved, and deficiency regions are reduced; thus, a high performance and highly reliable semiconductor device can be manufactured.

Further, the wirings 172 and the wirings 174 are electrically connected to each other, so that the n-channel field-effect transistor and the p-channel field-effect transistor can be electrically connected to each other, thereby forming a CMOS transistor.

Note that one embodiment of the present invention can be applied in manufacturing semiconductor devices including various functions such as microprocessors, integrated circuits such as image processing circuits, RF tags for transmitting and receiving data with an interrogator without contact, and semiconductor display devices by combining a plurality of transistors described in this embodiment. The semiconductor display devices include the following in its category: liquid crystal display devices, light-emitting devices in which a light-emitting element typified by an organic light-emitting element (OLED) is provided for each pixel, digital micromirror devices (DMDs), plasma display panels (PDPs), field emission displays (FEDs), and other semiconductor display devices in which a circuit element using a semiconductor film is included in a driver circuit. Note that the structure of the transistors described in this embodiment is one example, and the structure is not limited to the structure illustrated in the drawings.

Note that the structure described in this embodiment can be combined with the structure described in any of other embodiments as appropriate.

Embodiment 3

In this embodiment, a method for manufacturing a semiconductor device in which sidewalls are formed differently from Embodiment 2 to form high-concentration impurity regions, low-concentration impurity regions, and a channel formation region in a semiconductor film is described with reference to FIGS. 7A to 7D.

First, in a manner similar to that of Embodiment 1, the insulating film 106, the insulating film 102, the semiconductor film 116, and the semiconductor film 118 are formed over the base substrate 108 and they are covered with the gate insulating film 120, the first conductive film 122, and the second conductive film 124 as illustrated in FIG. 4C.

Next, the resist mask 126 and the resist mask 128 are selectively formed over the second conductive film 124. Then, the first conductive film 122 and the second conductive film 124 are etched using the resist mask 126 and the resist mask 128. Accordingly, a gate electrode 208 with a two-layer structure formed using a first conductive film 200 and a second conductive film 204 is formed over the semiconductor film 116, and a gate electrode 210 with a two-layer structure formed using a first conductive film 202 and a second conductive film 206 is formed over the semiconductor film 118. At this time, it is preferable that the gate electrode 208 and the gate electrode 210 do not have tapered shapes, which is different from Embodiment 1.

Figure 7A:
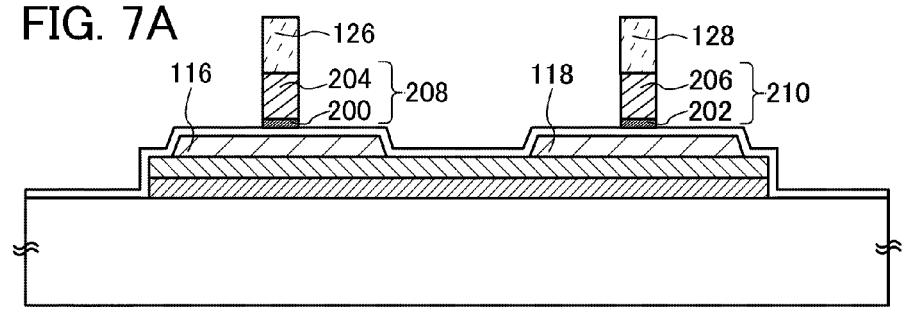
FIGS. 7A to 7D are diagrams illustrating an example of a method for manufacturing a semiconductor device according to one embodiment of the present invention.
Figure 7B:
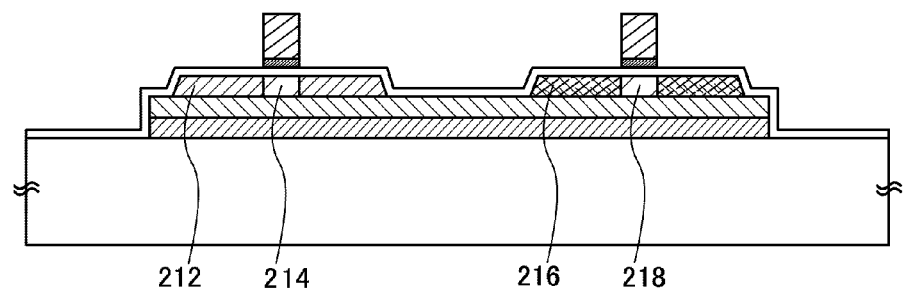

Then, as illustrated in FIG. 7B, impurity elements each imparting one conductivity type are added to the semiconductor film 116 and the semiconductor film 118 using the gate electrode 208 and the gate electrode 210 as masks. Here, in order to form a p-channel field-effect transistor, a p-type impurity element such as boron, aluminum, or gallium is added as the p-type impurity element to the semiconductor film 118. In addition, in order to form an n-channel field-effect transistor, an n-type impurity element such as phosphorus or arsenic is added as the n-type impurity element to the semiconductor film 116. Note that when the impurity element imparting p-type conductivity is added to the semiconductor film 118, the semiconductor film 116 to which the n-type impurity element is added is covered with a mask or the like so that the impurity element imparting p-type conductivity is added selectively. In contrast, when the impurity element imparting n-type conductivity is added to the semiconductor film 116, the semiconductor film 118 to which the p-type impurity element is added is covered with a mask or the like so that the impurity element imparting n-type conductivity is added selectively. Alternatively, after an impurity element imparting one of the p-type conductivity and the n-type conductivity is added to the semiconductor films 116 and 118, an impurity element imparting the other conductivity may be selectively added to one of the semiconductor films 116 and 118 at a higher concentration than that of the previously added impurity element. By the above-described addition of impurity elements, low-concentration impurity regions 212 and a channel formation region 214 are formed in the semiconductor film 116 and low-concentration impurity regions 216 and a channel formation region 218 are formed in the semiconductor film 118 in a self-aligned manner.

Figure 7C:
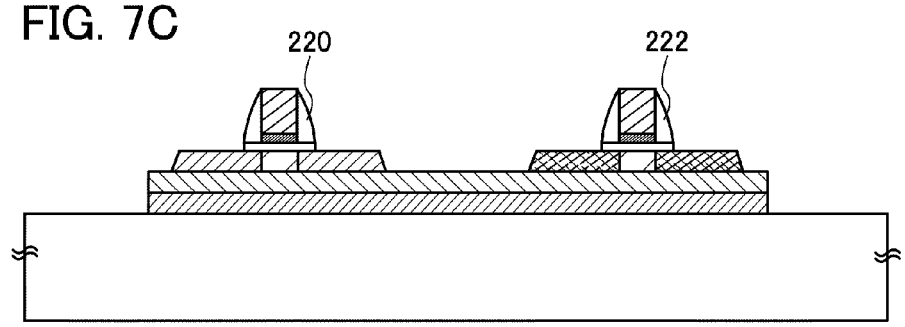

Next, as illustrated in FIG. 7C, sidewalls 220 are formed on side surfaces of the gate electrode 208, and sidewalls 222 are formed on side surfaces of the gate electrode 210. For example, the sidewalls 220 and the sidewalls 222 can be formed in such a manner that an insulating film is newly formed so as to cover the gate insulating film 120 and the gate electrodes 208 and 210 and the insulating film is partially etched by anisotropic etching in which etching is performed mainly in a perpendicular direction. By the anisotropic etching, the newly formed insulating film is partially etched, so that the sidewalls 220 are formed on the side surfaces of the gate electrode 208 and the sidewalls 222 are formed on the side surface of the gate electrode 210. Note that the gate insulating film 120 may be partially etched by the above-described anisotropic etching. The insulating film for forming the sidewalls 220 and the sidewalls 222 can be formed using a single layer or a stack of layers of a silicon film, a silicon oxide film, a silicon nitride oxide film, a silicon oxynitride film, or a film including an organic material such as an organic resin by a plasma-enhanced CVD method, a sputtering method, or the like. In this embodiment, a 100-nm-thick silicon oxide film is formed by a plasma-enhanced CVD method. In addition, as an etching gas, a mixed gas of $CHF_3$ and He can be used. Note that the process for forming the sidewalls 220 and 222 is not limited to these steps.

Figure 7D:
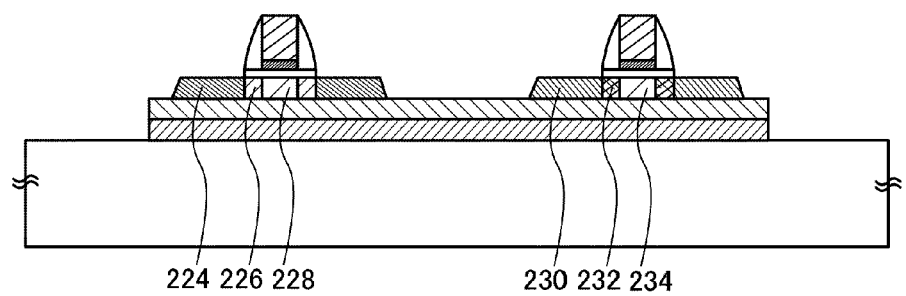

Next, as illustrated in FIG. 7D, impurity elements each imparting one conductivity type are added to the semiconductor film 116 and the semiconductor film 118 with the use of the gate electrode 208, the gate electrode 210, the sidewalls 220, and the sidewalls 222 as masks. Note that the impurity elements imparting the same conductivity type as the impurity elements which have been added to the semiconductor films 116 and 118 in the previous step are added to the semiconductor films 116 and 118 at higher concentration than in the previous step. Note that when the impurity element imparting p-type conductivity is added to the semiconductor film 118, the semiconductor film 116 to which the n-type impurity element is added is covered with a mask or the like so that the impurity element imparting p-type conductivity is added selectively. Further, when the impurity element imparting n-type conductivity is added to the semiconductor film 116, the semiconductor film 118 to which the p-type impurity element is added is covered with a mask or the like so that the impurity element imparting n-type conductivity is added selectively.

By the above-described addition of impurity element, a pair of high-concentration impurity regions 224, a pair of low-concentration impurity regions 226, and a channel formation region 228 are formed in the semiconductor film 116 in a self-aligned manner. Further, by the above-described addition of impurity element, a pair of high-concentration impurity regions 230, a pair of low-concentration impurity regions 232, and a channel formation region 234 are formed in the semiconductor film 118 in a self-aligned manner. The high-concentration impurity regions 224 and 230 function as source and drain regions, and the low-concentration impurity regions 226 and 232 function as lightly doped drain (LDD) regions.

In the process for manufacturing the SOI substrate used for the semiconductor device in this embodiment, the SOI substrate is provided with the single crystal semiconductor film in which crystal defects are repaired, planarity is improved, and deficiency regions are reduced. Thus, a high performance and highly reliable semiconductor device can be manufactured.

The following process can be performed with reference to Embodiment 1; thus, a semiconductor device can be manufactured.

Embodiment 4

Figure 9:
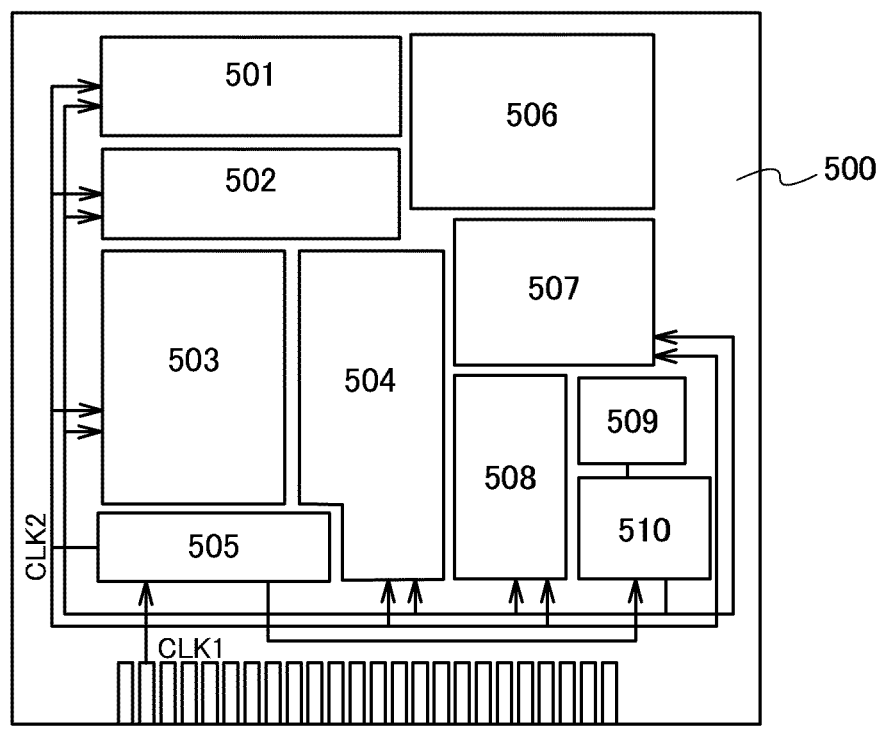
FIG. 9 is a diagram illustrating an example of a semiconductor device according to one embodiment of the present invention.

In this embodiment, a specific mode of a semiconductor device manufactured by application of an embodiment of the present invention is described with reference to FIG. 9 and FIG. 10.

First, a microprocessor is described as an example of a semiconductor device. FIG. 9 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory (ROM) 509, and a ROM interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 judges an interrupt request from an external input and output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 9, the internal clock signal CLK2 is input to another circuit.

Next, an example of a semiconductor device having a function of transmitting and receiving data wirelessly and also having an arithmetic function is described. FIG. 10 is a block diagram illustrating a structural example of a semiconductor device. The semiconductor device illustrated in FIG. 10 can be referred to as a computer (hereinafter referred to as an "RFCPU") which operates by transmitting and receiving signals to and from an external device by wireless communication.

Figure 10:
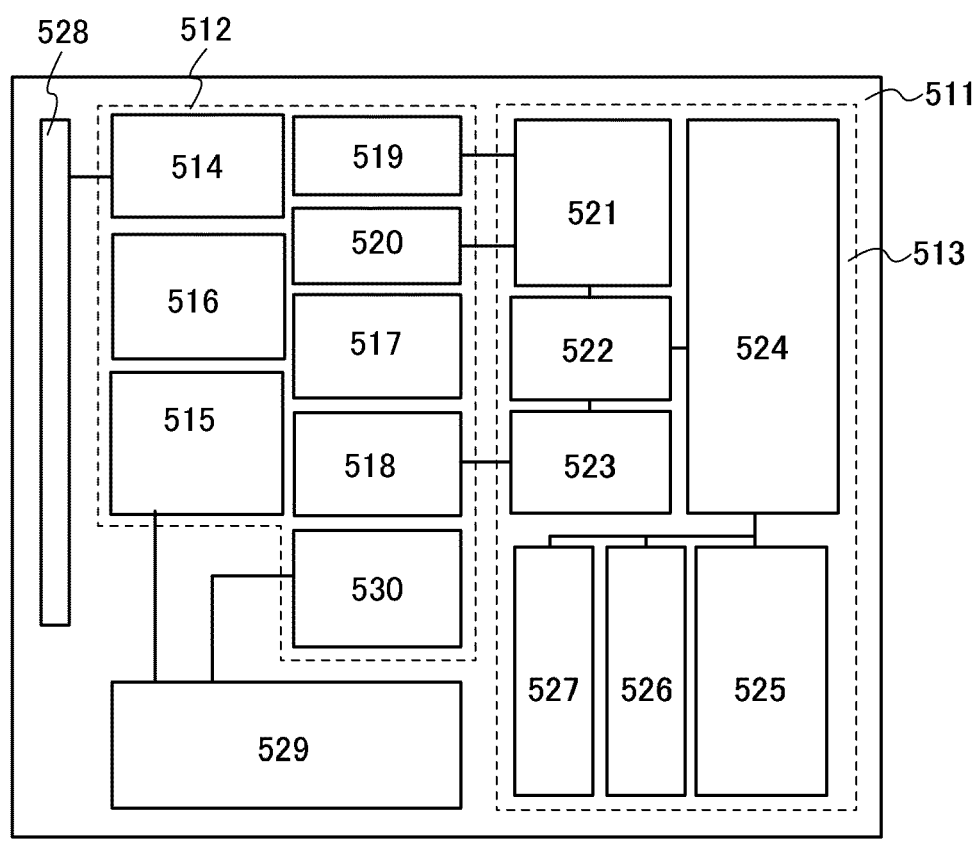
FIG. 10 is a diagram illustrating an example of a semiconductor device according to one embodiment of the present invention.

As illustrated in FIG. 10, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit (CPU) 525, a random access memory (RAM) 526, and a read only memory (ROM) 527.

The operation of the RFCPU 511 is roughly described below. The resonance circuit 514 generates induced electromotive force based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a different component.

The reset circuit 517 generates a signal that resets and initializes the digital circuit portion 513. For example, the reset circuit generates a signal which rises with delay after increase in power supply voltage as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on the fluctuations in the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and duty ratio of a clock signal in accordance with the power supply voltage or a consumption current of the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and executed. Alternatively, a method in which a circuit dedicated to arithmetic is formed and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

In the process for manufacturing the SOI substrate used for the microprocessor and the RFCPU in this embodiment, the SOI substrate is provided with the single crystal semiconductor film in which crystal defects are repaired, planarity is improved, and deficiency regions are reduced. Thus, a high performance and highly reliable semiconductor device can be manufactured.

Note that the structure described in this embodiment can be combined with any of the structures described in other embodiments as appropriate.

Embodiment 5

In this embodiment, a display device manufactured by application of any of the semiconductor devices described in the above embodiments is described with reference to FIGS. 11A and 11B and FIGS. 12A and 12B.

Figure 11A:
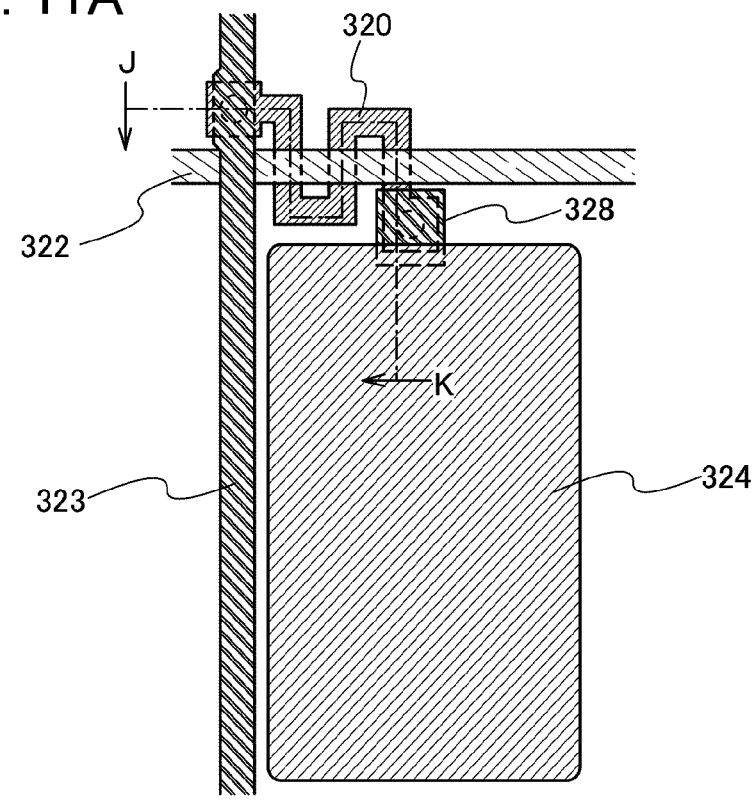
FIGS. 11A and 11B are diagrams illustrating an example of a display device using a semiconductor device according to one embodiment of the present invention.
Figure 11B:
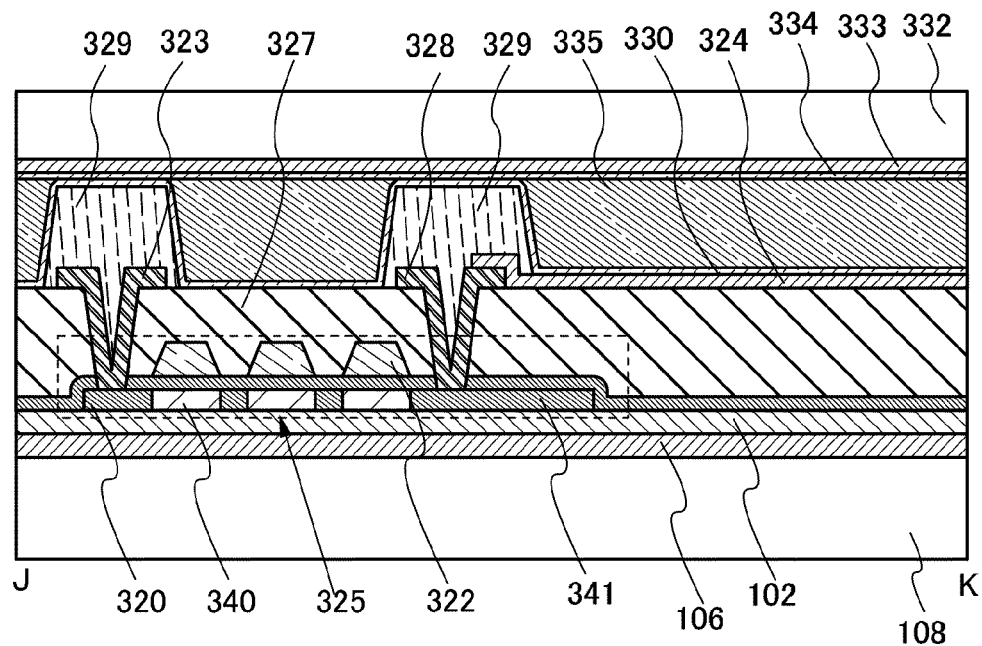

First, a liquid crystal display device is described with reference to FIGS. 11A and 11B. FIG. 11A is a plan view of a pixel of the liquid crystal display device and FIG. 11B is a cross-sectional view taken along the line J-K in FIG. 11A.

As illustrated in FIG. 11A, a pixel includes a single crystal semiconductor film 320, a scanning line 322 intersecting with the single crystal semiconductor film 320, a signal line 323 intersecting with the scanning line 322, a pixel electrode 324, and an electrode 328 which electrically connects the pixel electrode 324 to the single crystal semiconductor film 320. The single crystal semiconductor film 320 is a layer formed using a single crystal semiconductor film provided over the base substrate 108 and is included in a TFT 325 of the pixel.

As an SOI substrate, the SOI substrate described in the above embodiment is used. As illustrated in FIG. 11B, the single crystal semiconductor film 320 is stacked over the base substrate 108 with the second insulating film 106 and the first insulating film 102 interposed therebetween. The single crystal semiconductor film 320 of the TFT 325 is a film formed by separating the single crystal semiconductor film of the SOI substrate for each element by etching. Channel formation regions 340 and n-type high-concentration impurity regions 341 to which an impurity element is added are formed in the single crystal semiconductor film 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over an interlayer insulating film 327. Over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed to keep the distance between the base substrate 108 and the counter substrate 332. A liquid crystal layer 335 is formed in the space formed by the columnar spacers 329. The interlayer insulating film 327 has a step at the connection portion between the high-concentration impurity regions 341 and each of the signal line 323 and the electrode 328 due to formation of contact holes; therefore, orientation of liquid crystals in the liquid crystal layer 335 is easily disordered at this connection portion. Therefore, the columnar spacers 329 are formed at these step portions to prevent disorder of liquid crystal orientation.

Figure 12A:
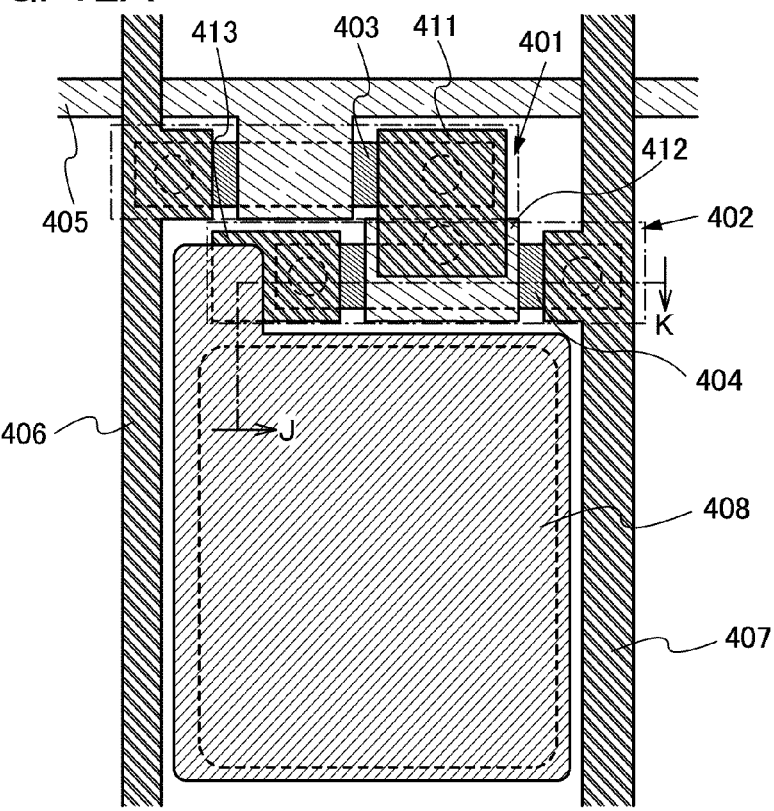
FIGS. 12A and 12B are diagrams illustrating an example of a display device using a semiconductor device according to one embodiment of the present invention.
Figure 12B:
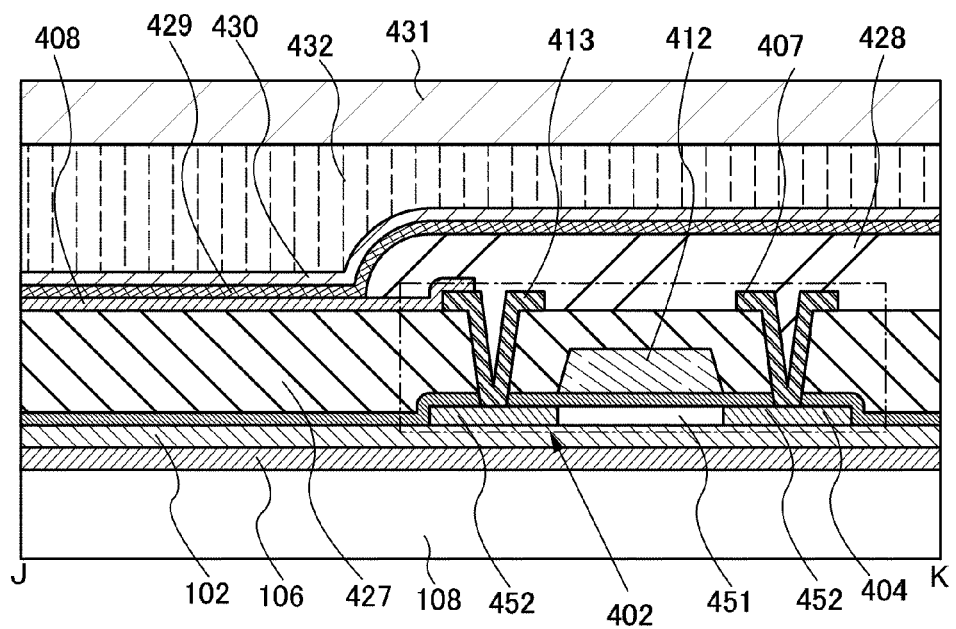

Next, an electroluminescent display device (hereinafter referred to as an "EL display device") is described with reference to FIGS. 12A and 12B. FIG. 12A is a plan view of a pixel of the EL display device, and FIG. 12B is a cross-sectional view taken along the line J-K in FIG. 12A.

As illustrated in FIG. 12A, the pixel includes a selection transistor 401 and a display control transistor 402, which are TFTs, a scan line 405, a signal line 406, a current supply line 407, and a pixel electrode 408. Each pixel is provided with a light-emitting element having a structure in which a layer including an electroluminescent material (this layer is also referred to as an "EL layer") is sandwiched between a pair of electrodes. One of the electrodes of the light-emitting element is the pixel electrode 408. Further, in a semiconductor film 403, a channel formation region, a source region, and a drain region of the selection transistor 401 are formed. Furthermore, in a semiconductor film 404, a channel formation region, a source region, and a drain region of the display control transistor 402 are formed. The semiconductor films 403 and 404 are layers formed using the single crystal semiconductor film provided over the base substrate.

In the selection transistor 401, a gate electrode is included in the scanning line 405, one of a source electrode and a drain electrode is included in the signal line 406, and the other thereof is formed as an electrode 410. In the display control transistor 402, a gate electrode 412 is electrically connected to an electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 12B, a channel formation region 451 and p-type high-concentration impurity regions 452 are formed in the semiconductor film 404. As an SOI substrate, the SOI substrate manufactured in the above embodiment is used.

An interlayer insulating film 427 is formed to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate and is fixed to the base substrate 108 by a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is difficult to employ the current driving method; in order to employ the current driving method in such a case, a correction circuit which corrects characteristic variations is needed. When the EL display device is manufactured by a manufacturing method including a manufacturing process of an SOI substrate and a gettering step, the selection transistor 401 and the display control transistor 402 do not have variations in characteristics from pixel to pixel. Accordingly, the current driving method can be employed.

Further, in the process for manufacturing the SOI substrate used for the liquid crystal display device and the EL display device, which are semiconductor devices described in this embodiment, the SOI substrate is provided with the single crystal semiconductor film in which crystal defects are repaired, planarity is improved, and deficiency regions are reduced. Thus, a high performance and highly reliable semiconductor device can be manufactured.

Note that the structure described in this embodiment can be combined with any of the structures described in other embodiments as appropriate.

Embodiment 6

In this embodiment, an electronic device manufactured by applying the semiconductor device described in any of the above embodiments is described with reference to FIGS. 13A to 13C and FIGS. 14A to 14C.

Various electronic devices can be manufactured with the use of SOI substrates. The electronic devices include, in its category, televisions, cameras such as video cameras and digital cameras, goggle-type displays (head mounted displays), navigation systems, audio reproducing devices (such as car audio systems or audio components), computers, laptop type computers, game machines, portable information terminals (such as mobile computers, mobile phones, portable game machines, and e-book readers), and image reproducing devices having storage media (specifically, devices provided with display devices capable of playing audio data stored in recording media such as digital versatile disk (DVD) and displaying stored image data). Examples thereof are illustrated in FIGS. 13A to 13C and FIGS. 14A to 14C.

Figure 13A:
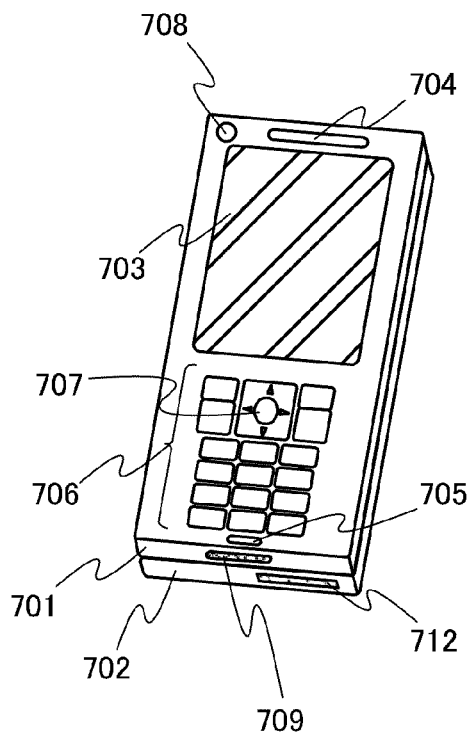
FIGS. 13A to 13C are diagrams illustrating an electronic device using a semiconductor device according to one embodiment of the present invention.
Figure 13B:
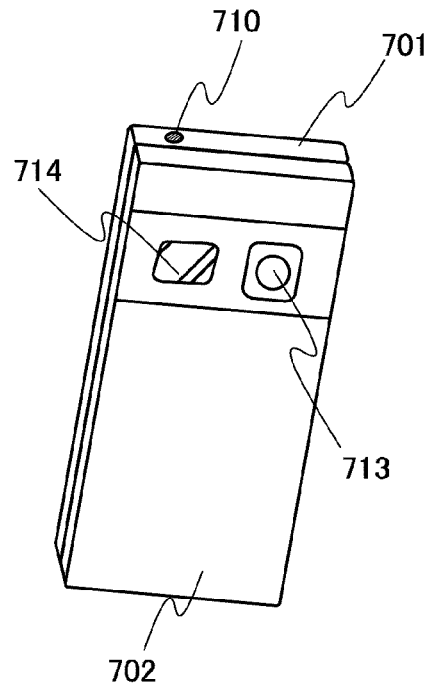
Figure 13C:
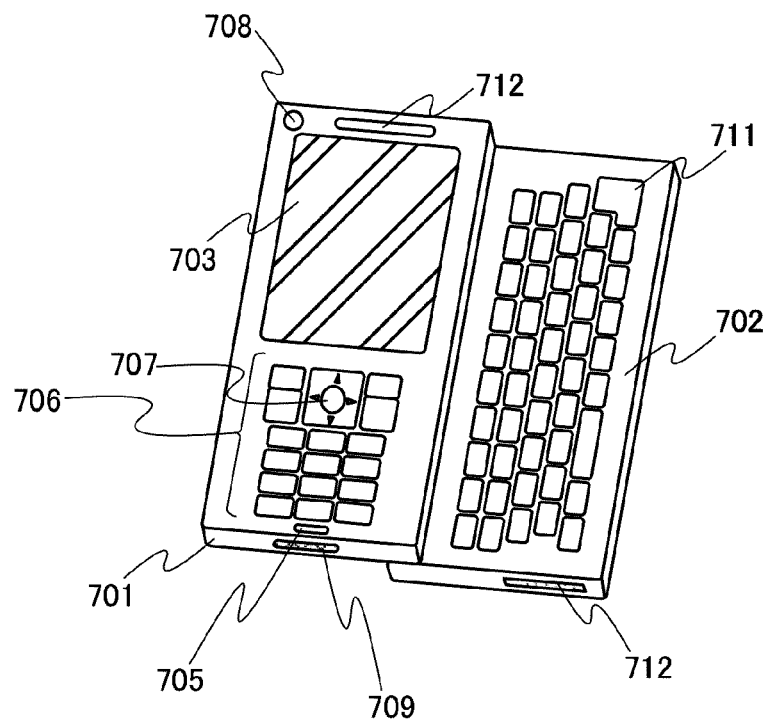

FIGS. 13A to 13C illustrate an example of a mobile phone. FIG. 13A is a front view, FIG. 13B is a rear view, and FIG. 13C is a development view when two housings slide. A mobile phone 700 includes two housings 701 and 702. The mobile phone 700 is a so-called smartphone which has both functions of a mobile phone and a portable information terminal, and incorporates a computer and can carry out a variety of data processing in addition to voice calls.

The mobile phone 700 includes the housing 701 and the housing 702. The housing 701 includes a display portion 703, a speaker 704, a microphone 705, operation keys 706, a pointing device 707, a front camera lens 708, a jack 709 for an external connection terminal, an earphone terminal 710, and the like, while the housing 702 includes a keyboard 711, an external memory slot 712, a rear camera 713, a light 714, and the like. In addition, an antenna is incorporated in the housing 701.

In addition to the above-described structure, a wireless IC chip, a small size memory device, or the like may be incorporated in the mobile phone 700.

The housings 701 and 702 overlapped with each other (illustrated in FIG. 13A) slide and can be developed as illustrated in FIG. 13C. The display panel or display device manufactured by the method for manufacturing a display device described in this embodiment can be incorporated in the display portion 703. Since the display portion 703 and the front camera lens 708 are provided in the same plane, the mobile phone 700 can be used as a videophone. A still image and a moving image can be taken by the rear camera 713 and the light 714 by using the display portion 703 as a viewfinder.

By using the speaker 704 and the microphone 705, the mobile phone 700 can be used as an audio recording device (sound recorder) or an audio reproducing device. With the use of the operation keys 706, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 700 as a portable information terminal, the use of the keyboard 711 is convenient. The housings 701 and 702 overlapped with each other (FIG. 13A) slide and can be developed as illustrated in FIG. 13C. In the case where the mobile phone 700 is used as a portable information terminal, smooth operation with the keyboard 711 and the pointing device 707 can be performed. The jack 709 for an external connection terminal can be connected to various cables such as an AC adapter or a USB cable, whereby the mobile phone 700 can be charged or can perform data communication with a personal computer or the like. Moreover, by inserting a recording medium into the external memory slot 712, a larger amount of data can be stored and transferred.

In the rear surface of the housing 702 (FIG. 13B), the rear camera 713 and the light 714 are provided, and a still image and a moving image can be taken by using the display portion 703 as a viewfinder.

Further, the mobile phone 700 may have an infrared communication function, a USB port, a function of receiving one segment television broadcast, a non-contact IC chip, an earphone jack, or the like, in addition to the above-described functions and structures.

Figure 14A:
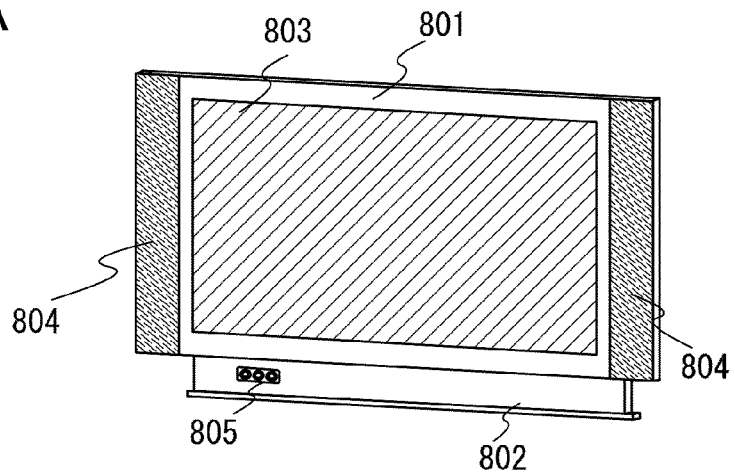
FIGS. 14A to 14C are diagrams each illustrating an electronic device using a semiconductor device according to one embodiment of the present invention.

FIG. 14A illustrates a display device, which includes a housing 801, a supporting base 802, a display portion 803, a speaker portion 804, a video input terminal 805, and the like. Note that the display device includes all devices for displaying information, such as for a personal computer, for receiving TV broadcasting, and for displaying an advertisement.

Figure 14B:
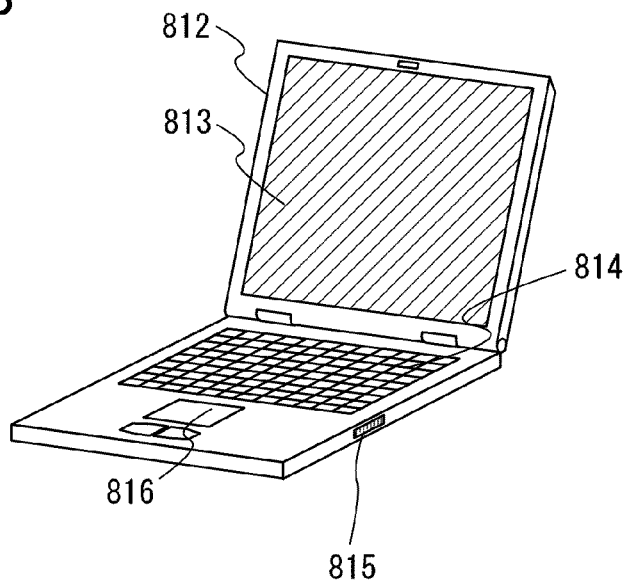

FIG. 14B illustrates a computer, which includes a housing 812, a display portion 813, a keyboard 814, an external connection port 815, a mouse 816, and the like.

Figure 14C:
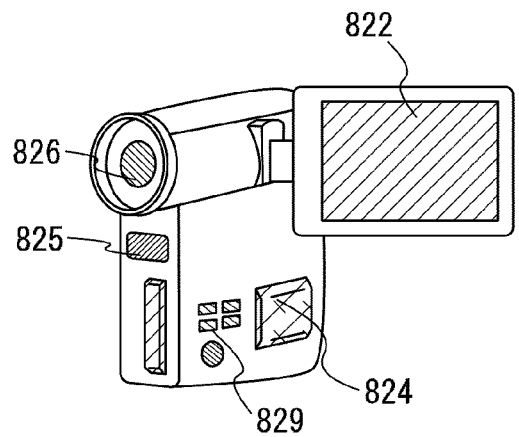

FIG. 14C illustrates a video camera, which includes a display portion 822, an external connection port 824, a remote control receiving portion 825, an image receiving portion 826, an operation key 829, and the like.

In the process for manufacturing the SOI substrate used for the electronic devices described in this embodiment, the SOI substrate in each of the electronic devices is provided with the single crystal semiconductor film in which crystal defects are repaired, planarity is improved, and deficiency regions are reduced. Thus, a high performance and highly reliable semiconductor device can be manufactured.

Note that the structure described in this embodiment can be combined with any of the structures described in other embodiments as appropriate.

Example 1

In this example, evaluation results of deficiency regions in single crystal silicon films of SOI substrates which are manufactured with various doses of hydrogen ions in formation of embrittled layers as sample substrates and are irradiated with laser light is described.

In this example, there were the following four conditions of doses of hydrogen ions in formation of embrittled layers: $1.8 \times 10^{16}$ ions/cm$^2$; $2.0 \times 10^{16}$ ions/cm$^2$; $2.2 \times 10^{16}$ ions/cm$^2$; and $2.4 \times 10^{16}$ ions/cm$^2$. Two sample substrates were manufactured under each of the conditions, and eight sample substrates were manufactured in total. The number of deficiency regions in single crystal silicon films over the SOI substrate was detected by a particle inspecting apparatus.

Next, a method for manufacturing sample substrates is described. Every substrate was manufactured under the same conditions except the dose of hydrogen ions in the formation of the embrittled layers. As a bond substrate, a single crystal silicon substrate which is a 5-inch square was used. First, a thermal oxide film was formed to a thickness of 100 nm by thermal oxidation of the single crystal silicon substrate in an HCl atmosphere. At this time, thermal oxidation was performed in an atmosphere containing HCl at 3 volume % with respect to oxygen at 950° C. for three hours.

Next, the single crystal silicon substrate was irradiated with hydrogen ions from the surface of the thermal oxide film by an ion doping apparatus. In this example, by irradiation with ionized hydrogen, an embrittled layer was formed in the single crystal silicon substrate. The ion doping was performed with an accelerating voltage of 40 kV. The irradiation with hydrogen ions was performed under the following four conditions of the dose of hydrogen ions: $1.8 \times 10^{16}$ ions/cm$^2$; $2.0 \times 10^{16}$ ions/cm$^2$; $2.2 \times 10^{16}$ ions/cm$^2$; and $2.4 \times 10^{16}$ ions/cm$^2$. The irradiation with hydrogen ions was performed on two single crystal silicon substrates with each ion dose, and the irradiation with hydrogen ions was performed on eight single crystal silicon substrates in total. At this time, the ratio between hydrogen ion species used for the irradiation was as follows: $H_2^+:H_3^+$ was about 3:2 (ions/cm$^2$) and a small amount of $H^+$ was also included.

Next, each single crystal silicon substrate was subjected to treatment with ozone water and megasonic cleaning as surface treatment.

Then, each single crystal silicon substrate was attached to a glass substrate with the thermal oxide film interposed therebetween. After that, heat treatment was performed at 200° C. for 120 minutes and heat treatment was further performed at 600° C. for 120 minutes in order to form a single crystal silicon film over the glass substrate. At this time, the thickness of the single crystal silicon film was about 140 nm.

Then, in order to remove a natural oxide film formed on a surface of the single crystal silicon film over each of the SOI substrates, a process was performed with a 100-fold diluted hydrofluoric acid for 110 seconds.

Next, the single crystal silicon film over each of the SOI substrates was irradiated with laser light. As a laser emitting the laser light, a XeCl excimer laser (wavelength: 308 nm, pulse width: 25 nanoseconds, and repetition rate: 30 Hz) was used. The cross section of laser light was shaped into a linear form of 150 mm×0.34 mm by an optical system, the scanning rate of laser light was set to 10 mm/sec, the scanning pitch was set to 33 μm, and the number of beam shots was set to about 10. The energy density was set in the range of 852 mJ/cm$^2$. An irradiation surface was irradiated with laser light while the surface was sprayed with a nitrogen gas. Through the above steps, the sample substrates each in which the single crystal silicon film was formed over the glass substrate were manufactured.

Then, the number of deficiency regions in the single crystal silicon film over each of the SOI substrates was detected by a particle inspecting apparatus (a glass substrate surface inspecting apparatus GI-4600 manufactured by Hitachi Engineering Co., Ltd.). In the particle inspecting apparatus, a sample substrate is irradiated with laser light having a wavelength of 780 nm and an output of 30 mW and then scattered light reflected at unevenness and light passing through the deficiency region are detected by an optical receiver, whereby the number of the deficiency regions can be counted. Laser light was operated in an X axis direction and the sample substrate was moved together with a table in a Y direction to scan a region of a single crystal silicon film having a size of 107 mm square, so that the deficiency regions of the single crystal silicon film were detected. Note that the particle inspecting apparatus used in this example recognizes the deficiency regions of the single crystal silicon as severe recessed portions and detects them. Therefore, because unevenness of a surface, dust, and a blemish are also detected, evaluation and comparison should be performed with the results regarded as qualitative numerical values.

Figure 15:
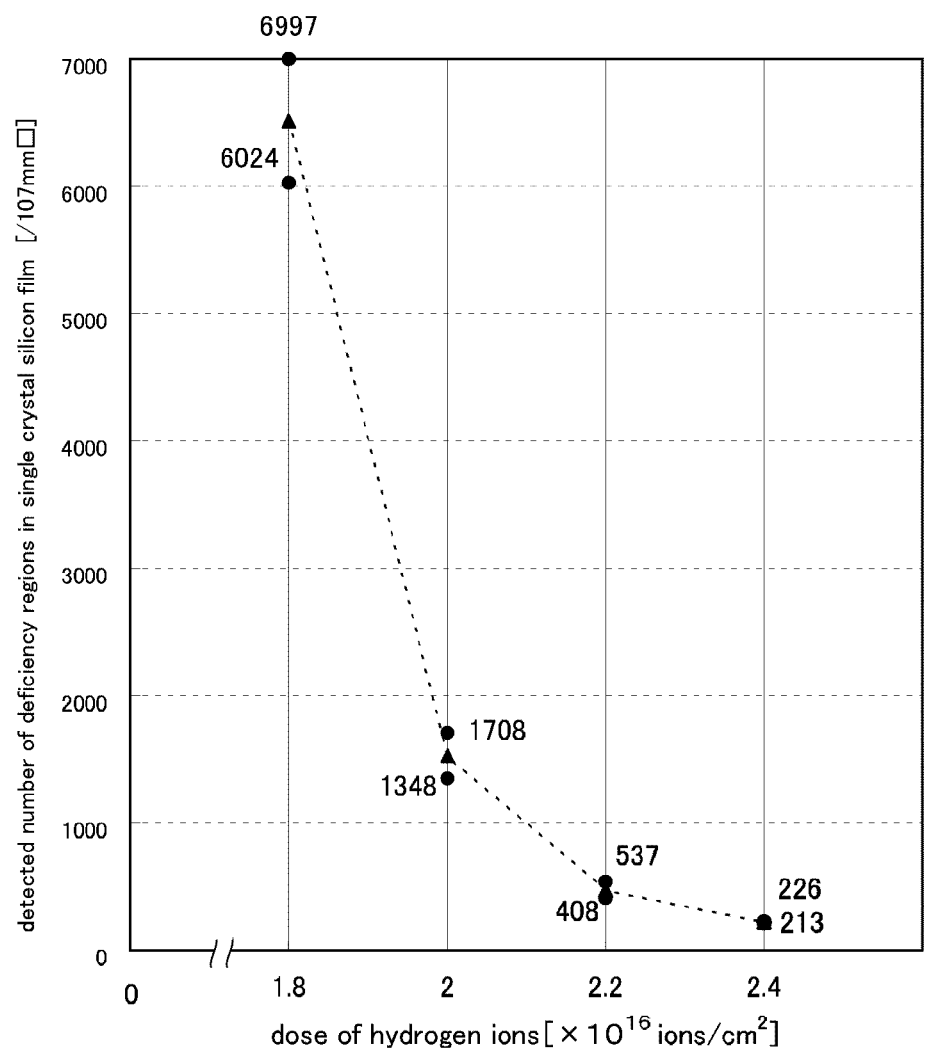
FIG. 15 is a graph comparing deficiency regions in single crystal silicon films in accordance with a change in a dose.

Results obtained by detecting deficiency regions in the single crystal silicon film of each of the sample substrates are shown in FIG. 15. In the graph of FIG. 15, the vertical axis indicates the number of deficiency regions in the single crystal silicon film [107 mm square], and the horizontal axis indicates a dose of hydrogen ions in the formation of the embrittled layer [×10$^{16}$ ions/cm$^2$]. The numbers of detected deficiency regions of two sample substrates per dose are shown in the graph, and the average values of two results of the numbers of detected deficiency regions are connected by a broken line. From FIG. 15, it can be seen that as the dose is increased, the number of deficiency regions is reduced. In particular, in the case of the sample substrate with the dose of 2.2×10$^{16}$ ions/cm$^2$, the number of deficiency regions was three digits and was drastically reduced as compared with the sample substrate with the dose of 1.8×10$^{16}$ and 2.0×10$^{16}$ ions/cm$^2$. Further, the number of deficiency regions of the sample substrate with the dose of 2.4×10$^{16}$ ions/cm$^2$ was about half the number of deficiency regions of the sample substrate with the dose of 2.2×10$^{16}$ ions/cm$^2$.

From the above, it was shown that by manufacturing the SOI substrate with the dose of hydrogen ions of 2.2×10$^{16}$ ions/cm$^2$ or more in the formation of the embrittled layer, the increase in the deficiency regions in the single crystal silicon film due to laser irradiation of the single crystal silicon film was able to be drastically suppressed.

Example 2

In this example, evaluation results, with a pattern inspecting apparatus, of deficiency regions in single crystal silicon films of SOI substrates which are manufactured with various doses of hydrogen ions in formation of embrittled layers as sample substrates and are irradiated with laser light is described.

In this example, there were the following three conditions of doses of hydrogen ions in formation of embrittled layers: 2.4×10$^{16}$ ions/cm$^2$; 2.6×10$^{16}$ ions/cm$^2$; and 3.0×10$^{16}$ ions/cm$^2$. Two sample substrates were manufactured under each of the conditions, and six sample substrates were manufactured in total. The number of deficiency regions in single crystal silicon films over SOI substrate was detected by a pattern inspecting apparatus.

The sample substrates were manufactured in a manner similar to Example 1 except conditions of the dose of hydrogen ions.

After six sample substrates were manufactured under the following conditions of the dose of hydrogen ions: 2.4×10$^{16}$ ions/cm$^2$; 2.6×10$^{16}$ ions/cm$^2$; and 3.0×10$^{16}$ ions/cm$^2$, the number of deficiency regions on a surface of the single crystal silicon film over each of the SOI substrates was detected by a pattern inspecting apparatus (VISION INSPECTOR Chip Defect Inspection System (Vi-1202) manufactured by TOPCON CORPORATION. In the pattern inspecting apparatus, an optical microscope image of a film surface is photographed by a digital camera and minute foreign objects and defects on a substrate are inspected by pattern matching image processing. In this pattern inspecting apparatus, light field images of the whole surfaces of the single crystal silicon films over substrates (107 mm square) were photographed with a reflective optical microscope. For photographing, an objective lens having a magnification of 5.0 times was used and microscope images with viewing angle of 1.2 mm×1.0 mm is converted into digital data by a charge coupled device (CCD). Each image date photographed by a CCD was divided into areas of 60×80 μm square and the luminance of the average image of pixels in an area to be focused and other two areas each surrounding the area to be focused, which are above, below, and on the right and left of the area to be focused (the average image of eight areas in total) (8 bits) were compared. It was determined that defects were caused in the original images when there was a pixel whose luminance is lower by 30 or more than luminance of other pixels. Further, an image of a defective point was photographed with an objective lens having a magnification of 200 times and was visually checked, deficiency regions of single crystal silicon and others (unevenness of a surface, dust and a blemish) were sorted, and the number of deficiency regions of single crystal silicon films was counted. The pattern inspecting apparatus described in this example is able to evaluate the number of deficiency regions of single crystal silicon films more accurately as compared with the particle inspecting apparatus described in Example 1.

Figure 16:
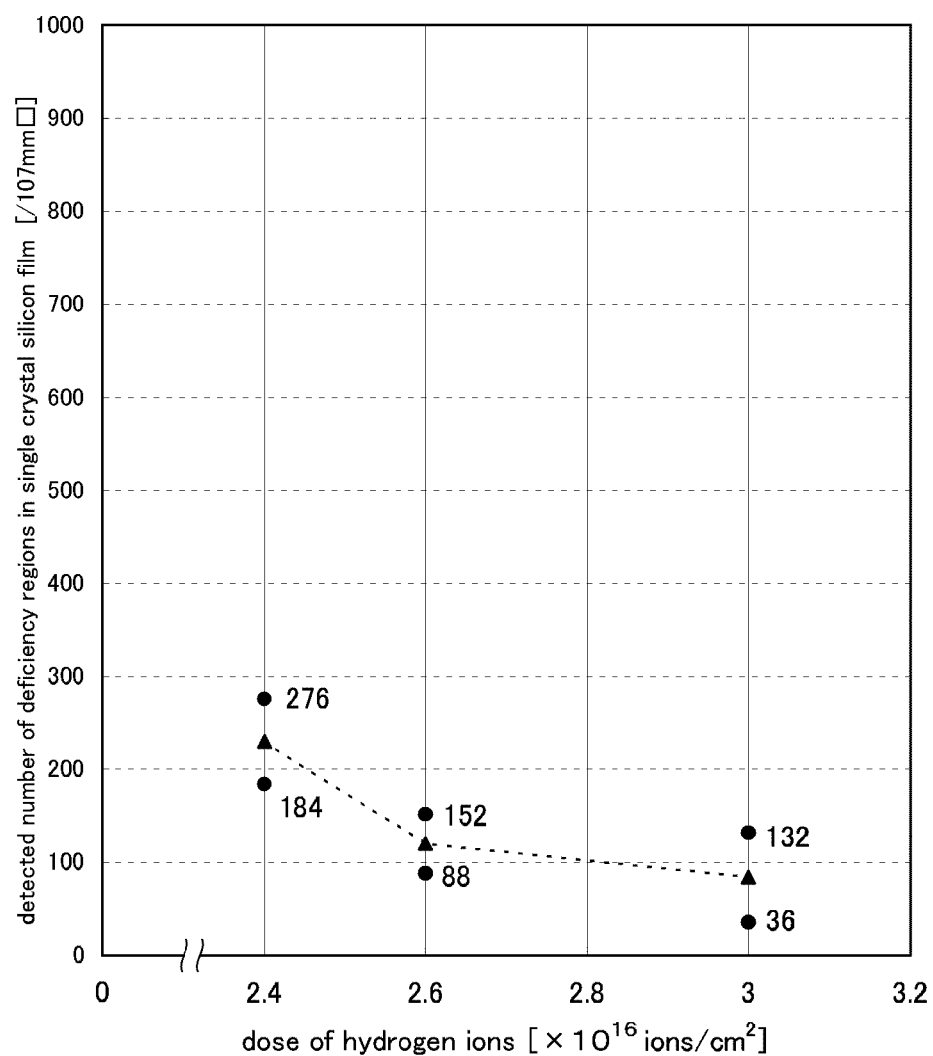
FIG. 16 is a graph comparing deficiency regions in single crystal silicon films in accordance with a change in a dose.

Results obtained by detecting deficiency regions in the single crystal silicon film of each of the sample substrates are shown in FIG. 16. In the graph of FIG. 16, the vertical axis indicates the number of deficiency regions in the single crystal silicon film [107 mm square], and the horizontal axis indicates a dose of hydrogen ions in the formation of the embrittled layer [×10$^{16}$ ions/cm$^2$]. The numbers of detected deficiency regions of two sample substrates per dose are shown in the graph, and the average values of two results of the numbers of detected deficiency regions are connected by a broken line. From FIG. 16, it can also be seen that as the dose is increased, the number of deficiency regions is reduced as in Example 1 even when the dose of hydrogen ions was 2.4× 10$^{16}$ ions/cm$^2$ or more. Further, it was found that when the dose of hydrogen ions was greater than or equal to 2.4×10$^{16}$ ions/cm$^2$ and less than or equal to 3.0×10$^{16}$ ions/cm$^2$, the number of deficiency regions in the single crystal silicon films was able to be reduced to in the range of about 30 to 300.

From the above, it was shown that by manufacturing the SOI substrate with the dose of hydrogen ions of greater than or equal to 2.4×10$^{16}$ ions/cm$^2$ and less than or equal to 3.0× 10$^{16}$ ions/cm$^2$ in the formation of the embrittled layer, the increase in deficiency regions caused in single crystal silicon films by irradiating the single crystal silicon films with laser light was able to be further suppressed.

Example 3

In this example, evaluation results of Raman spectrum measurement of deficiency regions in single crystal silicon films of SOI substrates which are manufactured with various doses of hydrogen ions in formation of embrittled layers as sample substrates and are irradiated with laser light is described.

In this example, as in Example 2, there were the following five conditions of doses of hydrogen ions in formation of embrittled layers: 2.0×10$^{16}$ ions/cm$^2$; 2.2×10$^{16}$ ions/cm$^2$; 2.4×10$^{16}$ ions/cm$^2$; 2.6×10$^{16}$ ions/cm$^2$; and 3.0×10$^{16}$ ions/cm$^2$. One sample substrate was manufactured under each of conditions, and five sample substrates were manufactured in total. The number of deficiency regions in single crystal silicon films over SOI substrates was detected by a pattern inspecting apparatus.

The sample substrates were manufactured in a manner similar to Example 1 except conditions of the dose of hydrogen ions.

After the five sample substrates were manufactured under the following conditions of the dose of hydrogen ions: 2.0× 10$^{16}$ ions/cm$^2$; 2.2×10$^{16}$ ions/cm$^2$; 2.4×10$^{16}$ ions/cm$^2$; 2.6× 10$^{16}$ ions/cm$^2$; and 3.0×10$^{16}$ ions/cm$^2$, Raman spectra of the single crystal silicon film were measured by a Raman microscopy apparatus: (U-1000 manufactured by HORIBA, Ltd.). In the Raman microscopy apparatus, with solid green laser light (λ=532 nm) was introduced to a microscope and was condensed by an objective lens in order to irradiate a surface of the single crystal silicon film with it. Scattered light from the sample was condensed and introduced into a spectroscope, the wavelengths of Rayleigh scattered light and Raman scattered light were divided and were detected by a multichannel detector, and the intensity of Raman scattered light and the wavelength distribution (Raman spectrum) were measured. In single crystal silicon, a sharp Raman line was observed as a Raman active optic phonon in the vicinity of 521 cm$^{-1}$. When crystallinity is lowered, full width at half maximum (FWHM) was increased and a peak position (a Raman shift) is shifted. In this example, ten points of Raman spectra were observed within the same sample surface and the Raman spectra were fitted to Lorentz function, so that the Raman shift and full width at half maximum of the Raman spectrum of each point were calculated.

Figure 17:
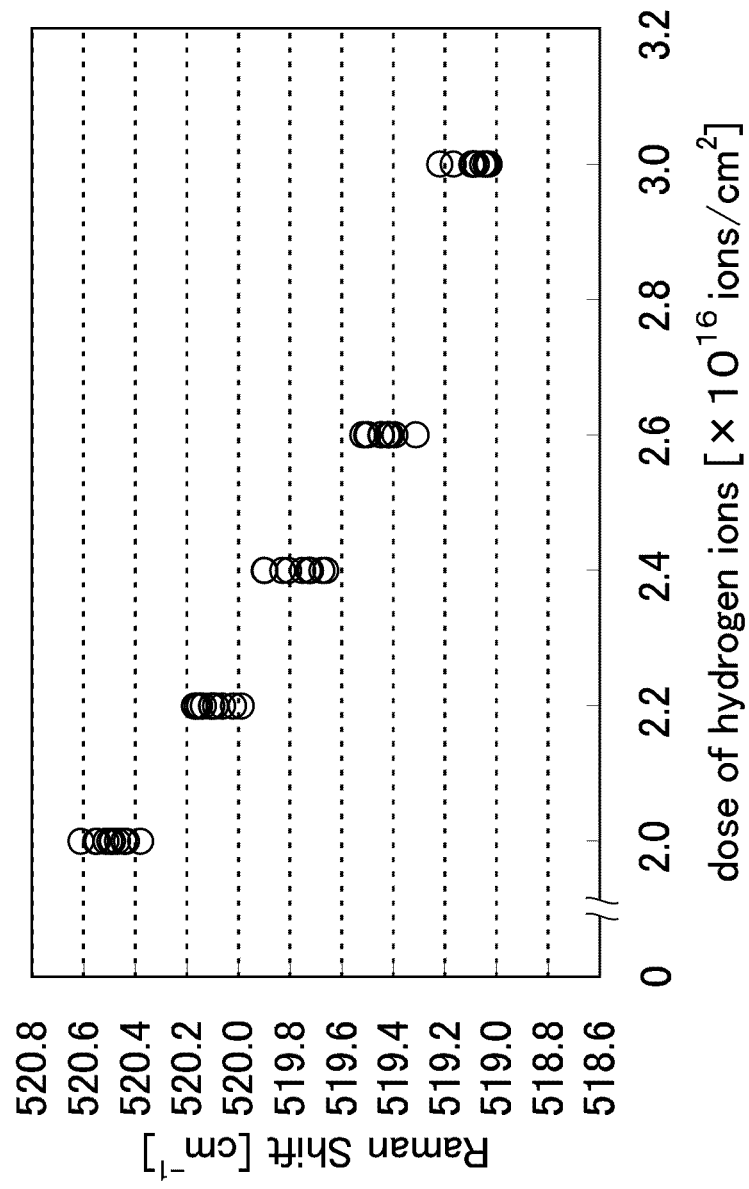
FIG. 17 is a graph comparing Raman shifts in single crystal silicon films in accordance with a change in a dose.
Figure 18:
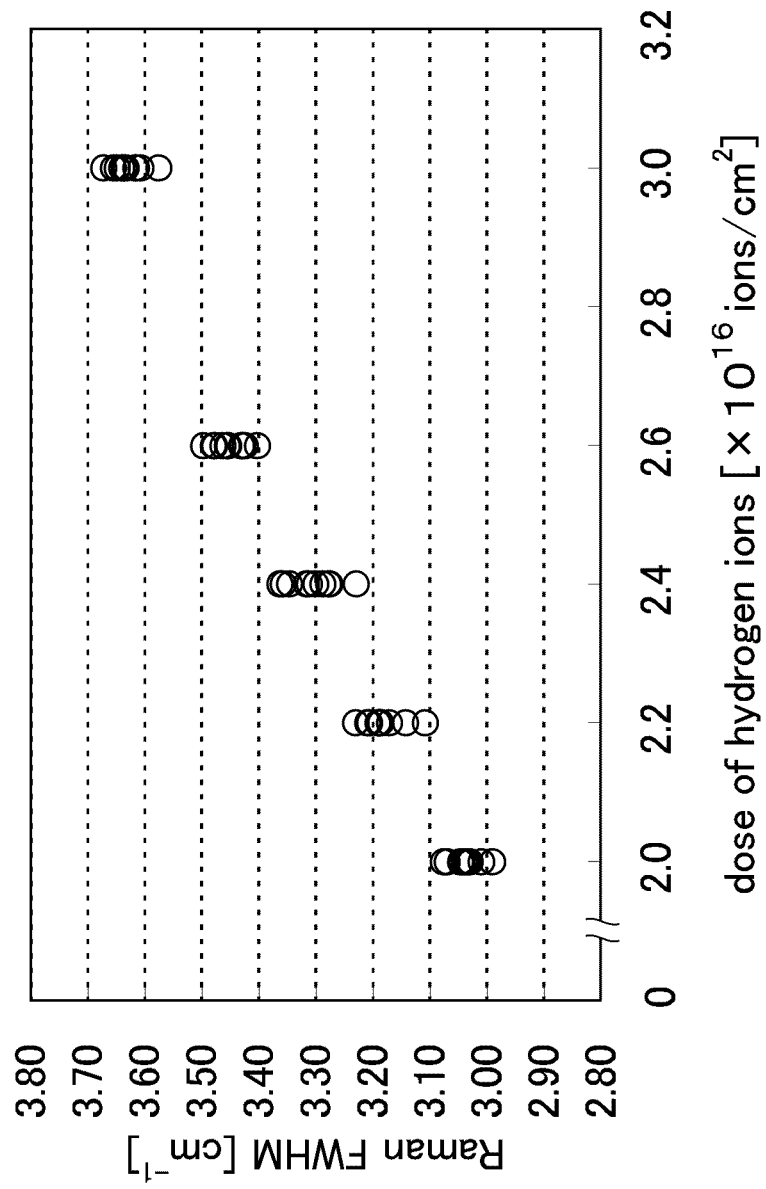
FIG. 18 is a graph comparing full width at half maximum of Raman peaks of single crystal silicon films in accordance with a change in a dose.

FIG. 17 and FIG. 18 show measurement results of Raman spectra of single crystal silicon films at each point of sample substrates. In the graph of FIG. 17, the vertical axis indicates a Raman shift [cm$^{-1}$] in the vicinity of 521 cm$^{-1}$, and the horizontal axis indicates a dose of hydrogen ions in the formation of the embrittled layer [×10$^{16}$ ions/cm$^2$]. In addition, in the graph of FIG. 18, the vertical axis indicates full width at half maximum (FWHM) of a Raman spectrum in the vicinity of 521 cm$^{-1}$, and the horizontal axis indicates a dose of hydrogen ions in the formation of the embrittled layer [×10$^{16}$ ions/cm$^2$]. From FIG. 17 and FIG. 18, there is a tendency that as the dose of hydrogen ions is increased, the Raman shift is away from 521 cm$^{-1}$, and full width at half maximum of the Raman spectrum is increased. In the case where the dose of hydrogen ions is 3.0×10$^{16}$ ions/cm$^2$, the Raman shift is in the vicinity of 519.0 cm$^{-1}$ and full width at half maximum of the Raman spectrum is in the vicinity of 3.60. It was not seen that crystallinity is lowered so much. However, it can be easily assumed that by further increasing the dose of hydrogen ions, crystallinity of the single crystal silicon film is lowered.

From the above, it was shown that by manufacturing the SOI substrate with the dose of hydrogen ions of 3.0×10$^{16}$ ions/cm$^2$ or less in formation of the embrittled layer, the SOI substrate having the single crystal silicon film with favorable crystallinity was able to be manufactured.

This application is based on Japanese Patent Application serial no. 2008-257032 filed with Japan Patent Office on Oct. 2, 2008, the entire contents of which are hereby incorporated by reference.

What is claimed is:

1. A method for manufacturing an SOI substrate, comprising:
   forming a first insulating film over a bond substrate;
   irradiating the bond substrate with hydrogen ions through the first insulating film to form an embrittled layer in the bond substrate;
   attaching the bond substrate to a base substrate with the first insulating film interposed therebetween;
   forming a semiconductor film over the base substrate by separating the bond substrate along the embrittled layer;
   performing a first planarization treatment by etching a surface of the semiconductor film, whereby a natural oxide film and crystal defects on the surface of the semiconductor film are removed; and
   performing a second planarization treatment by irradiating the semiconductor film with laser light, whereby crystallinity of the semiconductor film is recovered,
   wherein an acceleration voltage of the hydrogen ions is greater than or equal to 10 kV and less than or equal to 200 kV at the step of irradiating the bond substrate,
   wherein a dose of the hydrogen ions is greater than or equal to 2.2×10$^{16}$ ions/cm$^2$ and less than or equal to 3.0×10$^{16}$ ions/cm$^2$, and
   wherein 2.2×10$^{16}$ ions/cm$^2$ is a dose 2.2 times as high as a minimal dose of hydrogen ions for separating the bond substrate and 3.0×10$^{16}$ ions/cm$^2$ is a dose 3.0 times as high as a minimal dose of hydrogen ions for separating the bond substrate.

2. The method for manufacturing an SOI substrate according to claim 1, wherein the semiconductor film is irradiated with the laser light so that the semiconductor film is partially melted.

3. The method for manufacturing an SOI substrate according to claim 1, wherein the first insulating film is formed using a single film or a plurality of stacked films selected from a silicon oxide film, a silicon nitride film, a silicon oxynitride film, and a silicon nitride oxide film.

4. The method for manufacturing an SOI substrate according to claim 1, wherein the first insulating film is a silicon oxide film and is formed using a chemical vapor deposition method using an organosilane gas.

5. The method for manufacturing an SOI substrate according to claim 1, wherein the first insulating film is a silicon oxide film and is formed using thermal oxidation of the bond substrate.

6. The method for manufacturing an SOI substrate according to claim 1, wherein the bond substrate is a single crystal silicon substrate.

7. The method for manufacturing an SOI substrate according to claim 1, wherein the base substrate is an aluminosilicate glass substrate, a barium borosilicate glass substrate, or an aluminoborosilicate glass substrate.

8. The method for manufacturing an SOI substrate according to claim 1, wherein irradiating the bond substrate with the hydrogen ions is performed using an ion doping apparatus.

9. The method for manufacturing an SOI substrate according to claim 1, wherein one or plural kinds of ions selected from $H^+$, $H_2^+$, and $H_3^+$ are included as the hydrogen ions.

10. The method for manufacturing an SOI substrate according to claim 1, wherein $H_3^+$ is contained at 70% or more with respect to a total amount of $H^+$, $H_2^+$, and $H_3^+$ in the hydrogen ions.

11. The method for manufacturing an SOI substrate according to claim 1, further comprising subjecting the semiconductor film to heat treatment at 500° C. to 700° C. after irradiating the semiconductor film with the laser light.

12. The method for manufacturing an SOI substrate according to claim 1, wherein the embrittled layer is formed at a depth of greater than or equal to 50 nm and less than or equal to 200 nm.

13. The method for manufacturing an SOI substrate according to claim 1, wherein a thickness of the first insulating film is 15 nm to 300 nm.

14. The method for manufacturing an SOI substrate according to claim 1, further comprising the steps of:
etching the semiconductor film and the first insulating film to expose a part of the base substrate; and
forming a second insulating film over and in contact with the semiconductor film and the part of the base substrate.

15. The method for manufacturing an SOI substrate according to claim 1, wherein a second insulating film is formed over and in contact with the base substrate.

16. The method for manufacturing an SOI substrate according to claim 15, wherein the second insulating film is a silicon nitride film or a silicon nitride oxide film.

17. A method for manufacturing an SOI substrate, comprising:
forming a first insulating film over a bond substrate;
irradiating the bond substrate with hydrogen ions through the first insulating film to form an embrittled layer having microvoids in the bond substrate;
attaching the bond substrate to a base substrate with the first insulating film interposed therebetween;
forming a semiconductor film over the base substrate by separating the bond substrate along the embrittled layer with heat treatment;
performing a first planarization treatment by etching a surface of the semiconductor film, whereby a natural oxide film and crystal defects on the surface of the semiconductor film are removed; and
performing a second planarization treatment by irradiating the semiconductor film with laser light, whereby crystallinity of the semiconductor film is recovered,
wherein the microvoids in the embrittled layer are combined with each other by the heat treatment,
wherein an acceleration voltage of the hydrogen ions is greater than or equal to 10 kV and less than or equal to 200 kV at the step of irradiating the bond substrate,
wherein a dose of the hydrogen ions is greater than or equal to $2.2 \times 10^{16}$ ions/cm$^2$ and less than or equal to $3.0 \times 10^{16}$ ions/cm$^2$, and
wherein $2.2 \times 10^{16}$ ions/cm$^2$ is a dose 2.2 times as high as a minimal dose of hydrogen ions for separating the bond substrate with the heat treatment and $3.0 \times 10^{16}$ ions/cm$^2$ is a dose 3.0 times as high as a minimal dose of hydrogen ions for separating the bond substrate with the heat treatment.

18. The method for manufacturing an SOI substrate according to claim 17, wherein the semiconductor film is irradiated with the laser light so that the semiconductor film is partially melted.

19. The method for manufacturing an SOI substrate according to claim 17, wherein the first insulating film is formed using a single film or a plurality of stacked films selected from a silicon oxide film, a silicon nitride film, a silicon oxynitride film, and a silicon nitride oxide film.

20. The method for manufacturing an SOI substrate according to claim 17, wherein the first insulating film is a silicon oxide film and is formed using a chemical vapor deposition method using an organosilane gas.

21. The method for manufacturing an SOI substrate according to claim 17, wherein the bond substrate is a single crystal silicon substrate.

22. The method for manufacturing an SOI substrate according to claim 17, wherein the base substrate is an aluminosilicate glass substrate, a barium borosilicate glass substrate, or an aluminoborosilicate glass substrate.

23. The method for manufacturing an SOI substrate according to claim 17, wherein irradiating the bond substrate with the hydrogen ions is performed using an ion doping apparatus.

24. The method for manufacturing an SOI substrate according to claim 17, wherein one or plural kinds of ions selected from $H^+$, $H_2^+$, and $H_3^+$ are included as the hydrogen ions.

25. The method for manufacturing an SOI substrate according to claim 17, wherein $H_3^+$ is contained at 70% or more with respect to a total amount of $H^+$, $H_2^+$, and $H_3^+$ in the hydrogen ions.

26. The method for manufacturing an SOI substrate according to claim 17, further comprising subjecting the semiconductor film to heat treatment at 500° C. to 700° C. after irradiating the semiconductor film with the laser light.

27. The method for manufacturing an SOI substrate according to claim 17, wherein the embrittled layer is formed at a depth of greater than or equal to 50 nm and less than or equal to 200 nm.

28. The method for manufacturing an SOI substrate according to claim 17, wherein a thickness of the first insulating film is 15 nm to 300 nm.

29. The method for manufacturing an SOI substrate according to claim 17, further comprising the steps of:
etching the semiconductor film and the first insulating film to expose a part of the base substrate; and
forming a second insulating film over and in contact with the semiconductor film and the part of the base substrate.

30. A method for manufacturing a semiconductor device, comprising:
   forming a first insulating film over a bond substrate;
   irradiating the bond substrate with hydrogen ions through the first insulating film to form an embrittled layer in the bond substrate;
   attaching the bond substrate to a base substrate with the first insulating film interposed therebetween;
   forming a semiconductor film over the base substrate by separating the bond substrate along the embrittled layer;
   performing a first planarization treatment by etching a surface of the semiconductor film, whereby a natural oxide film and crystal defects on the surface of the semiconductor film are removed;
   performing a second planarization treatment by irradiating the semiconductor film with laser light, whereby crystallinity of the semiconductor film is recovered;
   forming a first semiconductor film and a second semiconductor film by etching the semiconductor film,
   wherein an acceleration voltage of the hydrogen ions is greater than or equal to 10 kV and less than or equal to 200 kV at the step of irradiating the bond substrate,
   wherein a dose of the hydrogen ions is greater than or equal to $2.2 \times 10^{16}$ ions/cm$^2$ and less than or equal to $3.0 \times 10^{16}$ ions/cm$^2$,
   wherein $2.2 \times 10^{16}$ ions/cm$^2$ is a dose 2.2 times as high as a minimal dose of hydrogen ions for separating the bond substrate and $3.0 \times 10^{16}$ ions/cm$^2$ is a dose 3.0 times as high as a minimal dose of hydrogen ions for separating the bond substrate, and
   wherein an n-channel transistor is formed by using the first semiconductor film and a p-channel transistor is formed by using the second semiconductor film.

31. The method for manufacturing a semiconductor device according to claim 30, wherein irradiating the bond substrate with the hydrogen ions is performed using an ion doping apparatus.

32. The method for manufacturing a semiconductor device according to claim 30, wherein one or plural kinds of ions selected from H$^+$, H$_2^+$, and H$_3^+$ are included as the hydrogen ions.

33. The method for manufacturing a semiconductor device according to claim 30, wherein H$_3^+$ is contained at 70% or more with respect to a total amount of H$^+$, H$_2^+$, and H$_3^+$ in the hydrogen ions.

34. The method for manufacturing a semiconductor device according to claim 30, further comprising subjecting the semiconductor film to heat treatment at 500° C. to 700° C. after irradiating the semiconductor film with the laser light.

35. A method for manufacturing a semiconductor device, comprising:
   forming a first insulating film over a bond substrate;
   irradiating the bond substrate with hydrogen ions through the first insulating film to form an embrittled layer having microvoids in the bond substrate;
   attaching the bond substrate to a base substrate with the first insulating film interposed therebetween;
   forming a semiconductor film over the base substrate by separating the bond substrate along the embrittled layer with heat treatment;
   performing a first planarization treatment by etching a surface of the semiconductor film, whereby a natural oxide film and crystal defects on the surface of the semiconductor film are removed;
   performing a second planarization treatment by irradiating the semiconductor film with laser light, whereby crystallinity of the semiconductor film is recovered;
   forming a first semiconductor film and a second semiconductor film by etching the semiconductor film,
   wherein the microvoids in the embrittled layer are combined with each other by the heat treatment,
   wherein an acceleration voltage of the hydrogen ions is greater than or equal to 10 kV and less than or equal to 200 kV at the step of irradiating the bond substrate,
   wherein a dose of the hydrogen ions is greater than or equal to $2.2 \times 10^{16}$ ions/cm$^2$ and less than or equal to $3.0 \times 10^{16}$ ions/cm$^2$,
   wherein $2.2 \times 10^{16}$ ions/cm$^2$ is a dose 2.2 times as high as a minimal dose of hydrogen ions for separating the bond substrate and $3.0 \times 10^{16}$ ions/cm$^2$ is a dose 3.0 times as high as a minimal dose of hydrogen ions for separating the bond substrate, and
   wherein an n-channel transistor is formed by using the first semiconductor film and a p-channel transistor is formed by using the second semiconductor film.

36. The method for manufacturing a semiconductor device according to claim 35, wherein irradiating the bond substrate with the hydrogen ions is performed using an ion doping apparatus.

37. The method for manufacturing a semiconductor device according to claim 35, wherein one or plural kinds of ions selected from H$^+$, H$_2^+$, and H$_3^+$ are included as the hydrogen ions.

38. The method for manufacturing a semiconductor device according to claim 35, wherein H$_3^+$ is contained at 70% or more with respect to a total amount of H$^+$, H$_2^+$, and H$_3^+$ in the hydrogen ions.

39. The method for manufacturing a semiconductor device according to claim 35, further comprising subjecting the semiconductor film to heat treatment at 500° C. to 700° C. after irradiating the semiconductor film with the laser light.

* * * * *